(12) United States Patent
Clara et al.

(10) Patent No.: US 10,461,203 B2
(45) Date of Patent: Oct. 29, 2019

(54) SEMICONDUCTOR DEVICES, A FLUID SENSOR AND A METHOD FOR FORMING A SEMICONDUCTOR DEVICE

(71) Applicant: Infineon Technologies AG, Neubiberg (DE)

(72) Inventors: Stefan Clara, Linz (AT); Thomas Grille, Villach (AT); Ursula Hedenig, Villach (AT); Peter Irsigler, Obernberg am Inn (AT); Bernhard Jakoby, Linz (AT); Ventsislav M. Lavchiev, Gallneukirchen (AT); Thomas Ostermann, Velden am Wörthersee (AT); Thomas Popp, Falkenstein/Gfäll (DE)

(73) Assignee: Infineon Technologie AG, Neubiberg (DE)

( * ) Notice: Subject to any disclaimer, the term of this patent is extended or adjusted under 35 U.S.C. 154(b) by 0 days.

(21) Appl. No.: 15/925,904

(22) Filed: Mar. 20, 2018

(65) Prior Publication Data
US 2018/0212085 A1 Jul. 26, 2018

Related U.S. Application Data

(62) Division of application No. 15/167,292, filed on May 27, 2016, now Pat. No. 9,941,432.

(30) Foreign Application Priority Data

May 28, 2015 (DE) .................. 10 2015 108 402

(51) Int. Cl.
*H01L 31/0352* (2006.01)
*H01L 33/06* (2010.01)
(Continued)

(52) U.S. Cl.
CPC ......... *H01L 31/035254* (2013.01); *H01L 31/035209* (2013.01); *H01L 31/035218* (2013.01);
(Continued)

(58) Field of Classification Search
CPC .......... H01L 31/035254; H01L 31/173; H01L 31/035218; H01L 31/1864; H01L 31/1812
See application file for complete search history.

(56) References Cited

U.S. PATENT DOCUMENTS 4,772,924 A * 9/1988 Bean .................. B82Y 20/00
257/19
5,293,050 A 3/1994 Chapple-Sokol et al.
(Continued)

FOREIGN PATENT DOCUMENTS

DE 60220803 T2 3/2008

OTHER PUBLICATIONS

Yakimov et al., "Effect of overgrowth temperature on the mid-infrared response of Ge/Si(001) quantum dots", Applied Physics Letters 100, 053507, pp. 1-3. (Year: 2012).*
(Continued)

*Primary Examiner* — Michael C Bryant
(74) *Attorney, Agent, or Firm* — Harrity & Harrity, LLP

(57) ABSTRACT

A semiconductor device comprises a plurality of quantum structures comprising predominantly germanium. The plurality of quantum structures are formed on a first semiconductor layer structure. The quantum structures of the plurality of quantum structures have a lateral dimension of less than 15 nm and an area density of at least $8 \times 10^{11}$ quantum structures per $cm^2$. The plurality of quantum structures are configured to emit light with a light emission maximum at a wavelength of between 2 μm and 10 μm or to absorb light with a light absorption maximum at a wavelength of between 2 μm and 10 μm.

9 Claims, 21 Drawing Sheets

(51) Int. Cl.
H01L 31/18 (2006.01)
H01L 31/173 (2006.01)

(52) U.S. Cl.
CPC ........ *H01L 31/173* (2013.01); *H01L 31/1812* (2013.01); *H01L 31/1864* (2013.01); *H01L 33/06* (2013.01); *H01L 2933/0033* (2013.01)

(56) References Cited

U.S. PATENT DOCUMENTS

| | | |
|---|---|---|
| 7,180,077 B1 | 2/2007 | Farhoomand |
| 2002/0039833 A1 | 4/2002 | Bensahel et al. |
| 2005/0053773 A1 | 3/2005 | Fukutani |
| 2010/0055824 A1 | 3/2010 | Lin |
| 2013/0119234 A1 | 5/2013 | Lee |
| 2014/0048772 A1 | 2/2014 | Kim et al. |
| 2016/0351739 A1 | 12/2016 | Clara et al. |

OTHER PUBLICATIONS

Ye et al., "Germanium Epitaxy on Silicon," Science and Technology of Advanced Materials, 15 024601, 10 pages.

Yakimov et al., "Effect of overgrowth temperature on the mid-infrared response of Ge/Si(001) quantum dots," http://scitation.aip.org/content/aip/journal/apl/100/5/10.1063/1.3682304, Feb. 3, 2012, 4 pages.

Zheng, "Growth and Study of Si/SiGe Multiple Quantum Wells for Mid-infrared Applications," https://www.princeton.edu/sturm/publications/m.s.e.-theses/weiwei_zheng_thesis.pdf, Dec. 2007, 84 pages.

Yakimov et al., "Influence of delta-doping on the performance of Ge/Si quantum-dot mid-infrared photodetectors," http://www.ncbi.nlm.nih.gov/pmc/articles/PMC4171572/, Aug. 13, 2012, 8 pages.

Liu et al., "Intersubband absorption in boron-doped multiple Ge quantum dots," http://ndl.ee.ucr.edu/apl-liu1.pdf, Jan. 11, 1999, 3 pages.

Wu et al., "Mid-infrared absorption in self-assembled Ge quantum dots grown on Si substrate," http://qsl.ee.ucr.edu/Publications/Conference%20papers/cno12.pdf, Jan. 1999, 6 pages.

Yakimov et al., "Midinfrared photoresponse of Ge quantum dots on a strained $Si_{0.65}Ge_{0.35}$ layer," https://www.researchgate.net/publication/230966808_Midinfrared_photoresponse_of_Ge_quantum_dots_on_a_strained_Si065Ge035_layer, May 23, 2011, 5 pages.

Lavchiev et al., "Si rib waveguide photodetector with an ordered array of Ge islands for 1.5 μm," https://www.researchgate.net/institution/Johannes_Kepler_University_Linz/department/Institut_fuer_Halbleiter-und_Festkoerperphysik2/publications, Dec. 15, 2009, 3 pages.

* cited by examiner

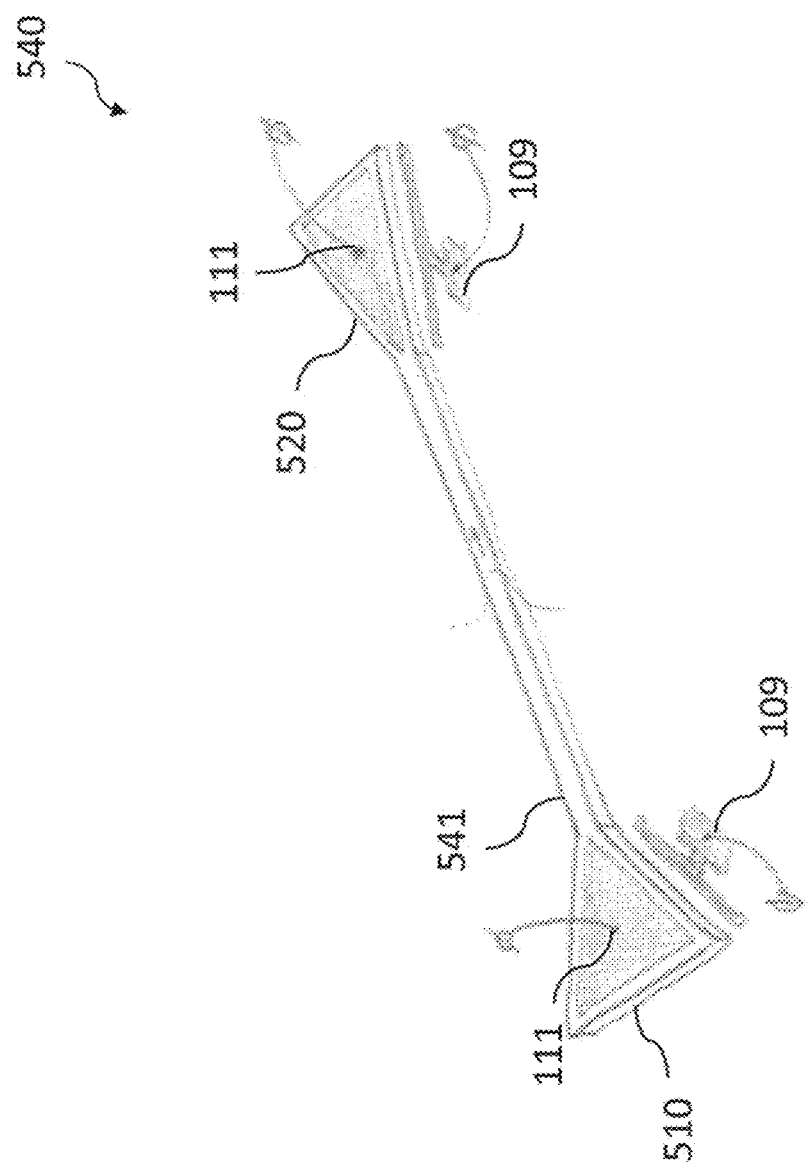

SEMICONDUCTOR DEVICES, A FLUID SENSOR AND A METHOD FOR FORMING A SEMICONDUCTOR DEVICE

RELATED APPLICATION

This application is a divisional of U.S. patent application Ser. No. 15/167,292, filed May 27, 2016, which claims priority under 35 U.S.C. § 119 to German Patent Application No. 102015108402.3, filed on May 28, 2015, the contents of which are incorporated by reference herein in their entirety.

TECHNICAL FIELD

Embodiments relate to detection systems and in particular to semiconductor devices, a fluid sensor and a method for forming a semiconductor device.

BACKGROUND

Mid-infrared (MIR) sources and detectors may be used in optoelectronic and photonic devices applications. Sources and detectors having indirect electronic band gaps may be inefficient emitters and detector of light, for example. Using nanotechnology, efficient emission and absorption of light may be achieved. By the scaling down and designing of nanostructures, efficiency of MIR sources and MIR detectors may be improved, for example.

SUMMARY

It is a demand to provide emitters and detectors with improved efficiency.

Such a demand may be satisfied by the subject-matter of the claims.

Some embodiments relate to a semiconductor device. The semiconductor device comprises a plurality of quantum structures comprising predominantly germanium. The plurality of quantum structures are formed on a first semiconductor layer structure. The quantum structures of the plurality of quantum structures have a lateral dimension of less than 15 nm and an area density of at least $8 \times 10^{11}$ quantum structures per $cm^2$. The plurality of quantum structures are configured to emit light with a light emission maximum at a wavelength of between 2 µm and 10 µm or to absorb light with a light absorption maximum at a wavelength of between 2 µm and 10 µm.

Some embodiments relate to a further semiconductor device. The semiconductor device comprises a plurality of quantum structures formed on a first semiconductor layer structure. The quantum structures of the plurality of quantum structures have a lateral dimension of less than 15 nm. The plurality of quantum structures comprise germanium and antimony. The plurality of quantum structures are configured to emit light with a light emission maximum at a wavelength of between 5 µm and 7 µm or to absorb light with a light absorption maximum at a wavelength of between 5 µm and 7 µm.

Some embodiments relate to a further semiconductor device. The semiconductor device comprises a quantum well layer stack comprising a plurality of first quantum well layers and a plurality of second quantum well layers. The first quantum well layers of the plurality of first quantum well layers and the second quantum well layers of the plurality of second quantum well layers are arranged alternatingly on a semiconductor layer structure. The first quantum well layers of the plurality of first quantum well layers comprise silicon-germanium and the second quantum well layers of the plurality of second quantum well layers comprise silicon. The first quantum well layers of the plurality of first quantum well layers and the second quantum well layers of the plurality of second quantum well layers have a thickness of below 100 nm. The quantum well layer stack is configured to emit light with a light emission maximum at a wavelength of between 2 µm and 10 µm or to absorb light with a light absorption maximum at a wavelength of between 2 µm and 10 µm.

Some embodiments relate to a method for forming a semiconductor device. The method comprises forming a plurality of quantum structures comprising predominantly germanium on a first semiconductor layer structure. The quantum structures of the plurality of quantum structures have a lateral dimension of less than 15 nm and an area density of at least $1 \times 10^{10}$ quantum structures per $cm^2$. The plurality of quantum structures are configured to emit light with a light emission maximum at a wavelength of between 2 µm and 10 µm or to absorb light with a light absorption maximum at a wavelength of between 2 µm and 10 µm, wherein the plurality of quantum structures are grown at least by using low pressure chemical vapor deposition.

Some embodiments relate to a fluid sensor comprising a detector comprising a processing module configured to generate a detection signal based on light emitted by an emitter and propagated through a fluid. The detector or the emitter comprises a plurality of quantum structures comprising predominantly germanium. The plurality of quantum structures are formed on a first semiconductor layer structure. The quantum structures of the plurality of quantum structures have a lateral dimension of less than 15 nm and an area density of at least $1 \times 10^{10}$ quantum structures per $cm^2$. The plurality of quantum structures are configured to emit light with a light emission maximum at a wavelength of between 2 µm and 10 µm or to absorb light with a light absorption maximum at a wavelength of between 2 µm and 10 µm.

Some embodiments of apparatuses and/or methods will be described in the following by way of example only, and with reference to the accompanying figures, in which

BRIEF DESCRIPTION OF THE FIGURES

FIGS. 5A to 5E show schematic illustrations of detection systems comprising an emitter device and a detector device according to various embodiments;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
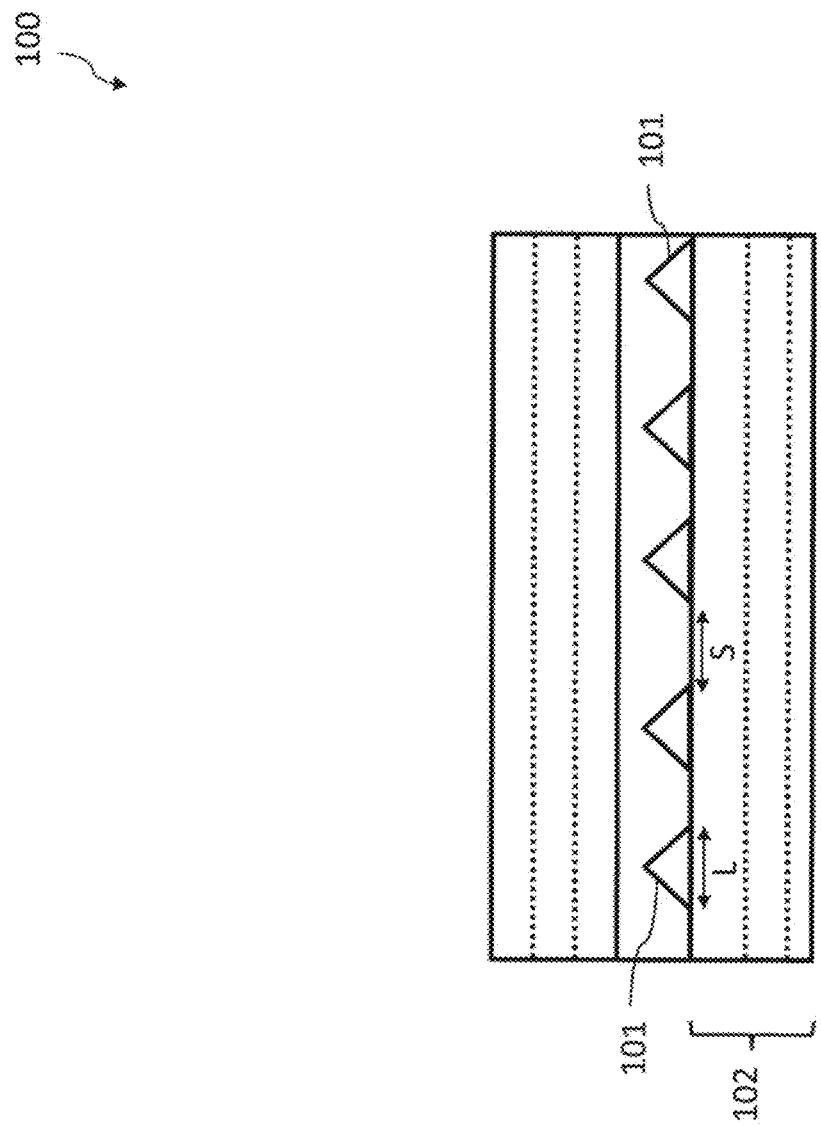
FIG. 1A shows a schematic illustration of a semiconductor device according to an embodiment.

FIG. 1A shows a schematic illustration of a semiconductor device 100 according to an embodiment.

The semiconductor device 100 includes a plurality of quantum structures 101 comprising predominantly germanium (Ge). The plurality of quantum structures 101 are formed on a first semiconductor layer structure 102. The quantum structures of the plurality of quantum structures 101 have a lateral dimension, L, of less than 15 nm and an area density of at least $8 \times 10^{11}$ quantum structures per $cm^2$. The plurality of quantum structures 101 are configured to emit light with a light emission maximum at a wavelength of between 2 µm and 10 µm or to absorb light with a light absorption maximum at a wavelength of between 2 µm and 10 µm.

Due to the quantum structures of the plurality of quantum structures 101 having a lateral dimension of less than 15 nm and an area density of at least $8 \times 10^{11}$ quantum structures per $cm^2$, a semiconductor device capable of emitting or absorbing light at wavelengths of importance for sensing and chemical imaging may be achieved or improved, for example. For example, the semiconductor device may be capable of sensing and chemical imaging in the automotive industry, of environmental sensing in factories and buildings and of humidity sensing. Furthermore, the semiconductor device may be capable of night vision, tomography or optical and digital imaging, for example.

A quantum structure of the plurality of quantum structures 101 may be a semiconductor structure. For example, the quantum structure may be grown or formed from or comprise a semiconductor material. A quantum structure may exhibit quantum mechanical properties due to its size. For example, excitons of the quantum structure may be confined in three spatial dimensions (e.g. along an x-axis, a y-axis and a z-axis). The plurality of quantum structures 101 may be or may include quantum dots, for example.

The lateral dimension, L, of the quantum structure of the plurality of quantum structures 101 may be a length, or a breadth of the quantum structure, for example. Additionally, alternatively or optionally, the lateral dimension may be a height or a diameter of the quantum structure, for example. The quantum structures of the plurality of quantum structures 101 may have an average or maximum lateral dimension of less than 15 nm (or e.g. less than 10 nm), for example. For example, an average or maximum lateral dimension of the plurality of quantum structures 101 may be about 15 nm.

An area density of the plurality of quantum structures 101 may be at least $8 \times 10^{11}$ quantum structures per $cm^2$. The area density may refer to a number of quantum structures per $cm^2$ formed on a semiconductor layer of the first semiconductor layer structure 102, for example. Optionally, the area density may lie between $1 \times 10^{10}$ quantum structures per $cm^2$ and $1 \times 10^{13}$ quantum structures per $cm^2$, for example. A separation distance, S, between neighboring quantum structures may be between 10 nm and 700 nm (or e.g. between 15 nm and 650 nm, or e.g. between 20 nm and 600 nm), for example. For example, the separation distance may be about 15 nm.

A (or each) quantum structure of the plurality of quantum structures 101 may be configured to emit light. Light emission may occur based on a relaxation of an excited electron to a ground state and recombination with a hole, for example. The plurality of quantum structures 101 may be configured to emit light and within a range or spectra of wavelengths. The light emission maximum (may be between 2 µm and 10 µm (or e.g. between 3 µm and 7.5 µm, or e.g. between 4 µm and 7 µm), for example. The light emission maximum may be a range of wavelengths within which a maximum spectral power or emission intensity is achieved, for example. For example, the light emission maximum may be a range of wavelengths within which greater than 50% (or e.g. greater than 70% or e.g. greater than 80%) of emitted light has a spectral wavelength falling within that range.

A (or each) quantum structure of the plurality of quantum structures 101 may be configured to absorb light. Light absorption may occur based on a quantum energy of a received photon matching an energy band gap of the quantum structure structures, for example. The plurality of quantum structures 101 may be configured to absorb light within a range or spectra of wavelengths. The light absorption maximum (may be between 5 µm and 7 µm (or e.g. between 4.5 µm and 7.5 µm, or e.g. between 5.5 µm and 6.5 µm), for example. The light absorption maximum may be a range of wavelengths within which maximum absorption is achieved, for example. For example, the light absorption maximum may be a range of wavelengths within which greater than 50% (or e.g. greater than 70% or e.g. greater than 80%) of absorbed light has a spectral wavelength falling within that range.

The plurality of quantum structures 101 may be pyramid shaped or dome shaped. The shape of the plurality of quantum structures may be based on a number of (germanium) monolayers forming the plurality of quantum structures 101. As the number of monolayers forming the quantum structures increases, the shape of the quantum structures may change from pyramid shaped to dome shaped. In other words, quantum structures having fewer monolayers of germanium (e.g. less than 20) may be pyramid shaped and quantum structures having more monolayers (e.g. more than 30) of germanium may be dome shaped.

Additionally, alternatively or optionally, the plurality of quantum structures 101 may include germanium and antimony. For example, the plurality of quantum structures may include between 1% to 20% (or e.g. between 1% to 10%, or e.g. 5%) antimony. The plurality of quantum structures 101 may include germanium inter-diffused with antimony, for example.

The first semiconductor layer structure 102 may include (or may be) at least one semiconductor layer. Optionally, the first semiconductor layer structure 102 may include a plurality of semiconductor layers.

The first semiconductor layer structure 102 may include a first silicon (Si) (epitaxial or monocrystalline) sub-layer having a doping of a first conductivity type (e.g. p-type), for example. In other words, the first silicon sub-layer may be a p-doped silicon layer. The first silicon sub-layer may be formed on (or e.g. directly on) a semiconductor substrate.

The semiconductor substrate may be a silicon-based semiconductor substrate, such as an intrinsic or doped (e.g. p-doped or n-doped) silicon substrate, or a silicon carbide (SiC) based semiconductor substrate, or a silicon nitride ($Si_3N_4$) based semiconductor substrate. Alternatively or optionally, the semiconductor substrate may be a gallium arsenide-based semiconductor substrate or gallium nitride-based semiconductor substrate, for example. The semiconductor substrate may be a boron doped p+ silicon substrate, for example. The semiconductor substrate may be a silicon on insulator (SOI) substrate, for example.

The semiconductor substrate may have a thickness of between 100 µm and 800 µm (e.g. 725 µm), for example.

The first silicon sub-layer may have a doping of the first conductivity type (e.g. a p-type doping). For example, the first silicon sub-layer may be referred to as a p-doped or p-Si layer. The first silicon sub-layer of the first semiconductor layer structure may have a higher concentration of acceptor doping atoms (e.g. group III atoms such as boron (B) atoms or aluminum (Al) atoms) than donor doping atoms (e.g. group V atoms such as phosphorus (P) atoms or arsenic (As) atoms). The higher concentration of acceptor doping atoms may result in the a p-doped silicon layer having a larger average hole concentration than an average electron concentration.

The first silicon sub-layer of the first semiconductor layer structure may have an average (net) doping concentration of acceptor doping atoms of between $1\times10^{13}$ $cm^{-3}$ (e.g. 13 Ohm cm) to $1\times10^{18}$ $cm^{-3}$ (e.g. 0.04 Ohm cm) (or e.g. between $5\times10^{13}$ $cm^{-3}$ to $5\times10^{17}$ $cm^{-3}$ (e.g. 0.07 Ohm cm) or e.g. between $1\times10^{15}$ $cm^{-3}$ (e.g. 13 Ohm cm) to $1\times10^{16}$ (e.g. 1.5 Ohm cm)), for example. The average doping concentration may be a number of doping atoms per volume averaged over a region of interest of the semiconductor layer (e.g. the first silicon sub-layer), for example.

The first silicon sub-layer of the first semiconductor layer structure may have a thickness of between 50 nm and 2000 nm (or e.g. between 100 nm and 1400 nm, or e.g. between 200 nm and 1000 nm), for example. For example, the first silicon sub-layer may have a thickness of about 1000 nm.

Additionally, alternatively or optionally, the first semiconductor layer structure 102 may further include a first (epitaxial or monocrystalline) silicon buffer sub-layer formed on the first silicon sub-layer. The first silicon buffer sub-layer of the first semiconductor layer structure may have a doping of a first conductivity type (e.g. may be a p-doped silicon layer). The first silicon buffer sub-layer may have an average (net) doping concentration of acceptor doping atoms of between $1\times10^{13}$ $cm^{-3}$ to $1\times10^{19}$ $cm^{-3}$ (or e.g. between $1\times10^{14}$ $cm^{-3}$ to $1\times10^{19}$ $cm^{-3}$ or e.g. between $1\times10^{16}$ $cm^{-3}$ to $1\times10^{19}$ $cm^{-3}$), for example. For example, the first silicon buffer sub-layer of the first semiconductor layer structure may have an average doping concentration of about $5\times10^{18}$ $cm^{-3}$. Additionally or optionally, the first silicon buffer sub-layer may be omitted from the first semiconductor layer structure.

The first silicon sub-layer of the first semiconductor layer structure may have a thickness of between 50 nm and 2000 nm (or e.g. between 100 nm and 1400 nm, or e.g. between 200 nm and 1000 nm), for example. For example, the first silicon sub-layer may have a thickness of about 1000 nm.

Optionally, the first silicon buffer sub-layer of the first semiconductor layer structure may be formed directly beneath or underneath the plurality of quantum structures 101, for example. In other words, the plurality of quantum structures 101 may be formed (or grown) directly on the first silicon buffer sub-layer.

The first silicon buffer sub-layer of the first semiconductor layer structure may be grown as a layer of improved crystallinity as compared to the first silicon sub-layer of the first semiconductor layer structure which may be commercial, for example.

Additionally or optionally, the first semiconductor layer structure may further include a first intrinsic silicon sub-layer, a highly-doped silicon sub-layer and a seed sub-layer including silicon-germanium (Si—Ge) or silicon doped with antimony (Sb) or boron (B) formed between the first silicon sub-layer and the plurality of quantum structures.

The first intrinsic silicon sub-layer of the first semiconductor layer structure may be formed on (e.g. directly on) the first silicon sub-layer (if the first silicon buffer sub-layer is omitted), for example. If the first silicon buffer sub-layer is included (e.g. formed on or directly on the first silicon sub-layer), then the first intrinsic silicon sub-layer of the first semiconductor layer structure may be formed on (e.g. directly on) the first silicon buffer sub-layer.

The first intrinsic silicon sub-layer of the first semiconductor layer structure may have a substantially equal number of donor atoms and acceptor atoms, for example. For example, the number of donor atoms may be within 50% of the number of acceptor atoms, for example.

The first intrinsic silicon sub-layer of the first semiconductor layer structure may have a thickness of between 50 nm and 2000 nm (or e.g. between 100 nm and 1400 nm, or e.g. between 200 nm and 1000 nm), for example. For example, the first silicon sub-layer may have a thickness of about 1000 nm.

Optionally, the first intrinsic silicon sub-layer of the first semiconductor layer structure may be formed directly beneath or underneath the plurality of quantum structures 101, for example. In other words, the plurality of quantum structures 101 may be formed (or grown) directly on the first silicon buffer sub-layer of the first semiconductor layer structure.

Additionally or optionally, the first semiconductor layer structure may further include a highly-doped silicon sub-layer formed between the first intrinsic silicon sub-layer and the plurality of quantum structures. For example, the highly-doped silicon sub-layer of the first semiconductor layer structure may be formed on (e.g. directly on) the first intrinsic silicon sub-layer.

The highly-doped silicon sub-layer of the first semiconductor layer structure may be a delta-doped silicon sub-layer, for example. For example, the delta-doped silicon sub-layer may have a concentration of dopant atoms within a few atomic layers of the surface of the delta-doped silicon sub-layer.

The highly-doped silicon sub-layer of the first semiconductor layer structure (e.g. the delta-doped silicon sub-layer) may have a thickness of about 5 nm to 10 nm, for example. The doping atoms of the delta-doped silicon sub-layer may be antimony or boron, for example.

The highly-doped silicon sub-layer of the first semiconductor layer structure (e.g. the delta-doped silicon sub-layer) may have a sheet hole or electron density of between $1\times10^{14}$ $cm^{-2}$ to $1\times10^{16}$ $cm^{-2}$ (or e.g. between $5\times10^{14}$ $cm^{-2}$ to $5\times10^{15}$ $cm^{-2}$ or e.g. between $1\times10^{15}$ $cm^{-2}$ to $5\times10^{15}$ $cm^{-2}$), for example. For example, the highly-doped silicon sub-layer of the first semiconductor layer structure may have a sheet hole or electron density of about $1\times10^{16}$ $cm^{-2}$, for example.

Additionally or optionally, the first semiconductor layer structure may further include a seed sub-layer including silicon-germanium or silicon doped with antimony or boron. The seed sub-layer may be formed between the highly-doped silicon sub-layer and the plurality of quantum structures, for example. For example, the seed sub-layer may be formed on (e.g. directly on) the highly-doped silicon sub-layer.

Optionally, the seed sub-layer of the first semiconductor layer structure may be a silicon-germanium layer. For example, the seed sub-layer of the first semiconductor layer structure may be a silicon$_x$-germanium$_{1-x}$ layer. x may lie between 0.25 and 0.35, for example.

Alternatively, the seed sub-layer of the first semiconductor layer structure may be an antimony (Sb)-doped silicon layer. The antimony-doped silicon layer may have an average (net) doping concentration of Sb doping atoms of between $1\times10^{15}$ $cm^{-3}$ to $1\times10^{19}$ $cm^{-3}$ (or e.g. between $1\times10^{16}$ $cm^{-3}$ to $1\times10^{19}$ $cm^{-3}$ or e.g. between $1\times10^{17}$ $cm^{-3}$ to $1\times10^{19}$ $cm^{-3}$), for example.

The seed sub-layer of the first semiconductor layer structure may have a thickness of between 50 nm and 350 nm (or e.g. between 70 nm and 250 nm, or e.g. between 175 nm and 225 nm), for example. For example, the seed sub-layer may have a thickness of about 100 nm.

The semiconductor device may further include a second semiconductor layer structure covering the plurality of quantum structures 101. The second semiconductor layer structure may include a first silicon sub-layer.

The first silicon sub-layer of the second semiconductor layer structure may have a doping of a second conductivity type (e.g. an n-type doping). For example, the first silicon sub-layer of the second semiconductor layer structure may be referred to as a n-doped or n-Si layer.

The first silicon sub-layer of the second semiconductor layer structure may have a higher concentration of donor doping atoms (e.g. group V atoms such as phosphorus (P) atoms or arsenic (As) atoms) than acceptor doping atoms (e.g. group III atoms such as boron (B) atoms or aluminum (Al) atoms), for example. The higher concentration of donor doping atoms may result in the n-doped silicon layer having a larger average electron concentration than an average hole concentration.

The first silicon sub-layer may have an average (net) doping concentration of donor doping atoms of between $1\times10^{15}$ $cm^{-3}$ to $1\times10^{19}$ $cm^{-3}$ (or e.g. between $1\times10^{16}$ $cm^{-3}$ to $1\times10^{19}$ $cm^{-3}$ or e.g. between $1\times10^{17}$ $cm^{-3}$ to $1\times10^{19}$ $cm^{-3}$), for example. For example, the average (net) doping concentration of donor doping atoms may be about $5\times10^{18}$ $cm^{-3}$.

Alternatively, the first silicon sub-layer of the second semiconductor layer structure may have a doping of the first conductivity type (e.g. a p-type doping). For example, the first silicon sub-layer may have an average (net) doping concentration of acceptor doping atoms of between $1\times10^{15}$ $cm^{-3}$ to $1\times10^{19}$ $cm^{-3}$ (or e.g. between $1\times10^{16}$ $cm^{-3}$ to $1\times10^{19}$ $cm^{-3}$ or e.g. between $1\times10^{17}$ $cm^{-3}$ to $1\times10^{19}$ $cm^{-3}$), for example. For example, the average (net) doping concentration of acceptor doping atoms may be about $5\times10^{18}$ $cm^{-3}$.

The first silicon sub-layer of the second semiconductor layer structure may have a thickness of between 50 nm and 500 nm (or e.g. between 100 nm and 400 nm, or e.g. between 200 nm and 300 nm), for example. For example, the first silicon sub-layer of the second semiconductor layer structure may have a thickness of about 200 nm.

The second semiconductor layer structure may further include an intrinsic silicon spacer layer covering the plurality of quantum structures 101. For example, the intrinsic silicon spacer layer may be arranged or formed between the plurality of quantum structures 101 and the first silicon sub-layer of the second semiconductor layer structure. For example, the intrinsic silicon spacer layer may directly cover the plurality of quantum structures 101. For example, the intrinsic silicon spacer layer may directly contact and directly surround the plurality of quantum structures 101. For example, the intrinsic silicon spacer layer may completely cover the plurality of quantum structures 101. For example, the intrinsic silicon spacer layer may be formed between neighboring quantum structures of the plurality of quantum structures 101.

The intrinsic silicon spacer layer of the second semiconductor layer structure may have a thickness of between 10 nm and 50 nm (or e.g. between 10 nm and 40 nm, or e.g. between 20 nm and 30 nm), for example. For example, the intrinsic silicon spacer layer of the second semiconductor layer structure may have a thickness of about 25 nm.

A tensile strain between the plurality of quantum structures, the first semiconductor layer structure and the intrinsic silicon spacer layer may lie between 1% and 4%, for example. Such a tensile strain may be introduced by a forming the plurality of quantum structures 101 on a strained seed sub-layer of the first semiconductor layer structure. For example, the seed sub-layer of the first semiconductor layer structure may be a strained silicon-germanium layer, for example.

Figure 1B:
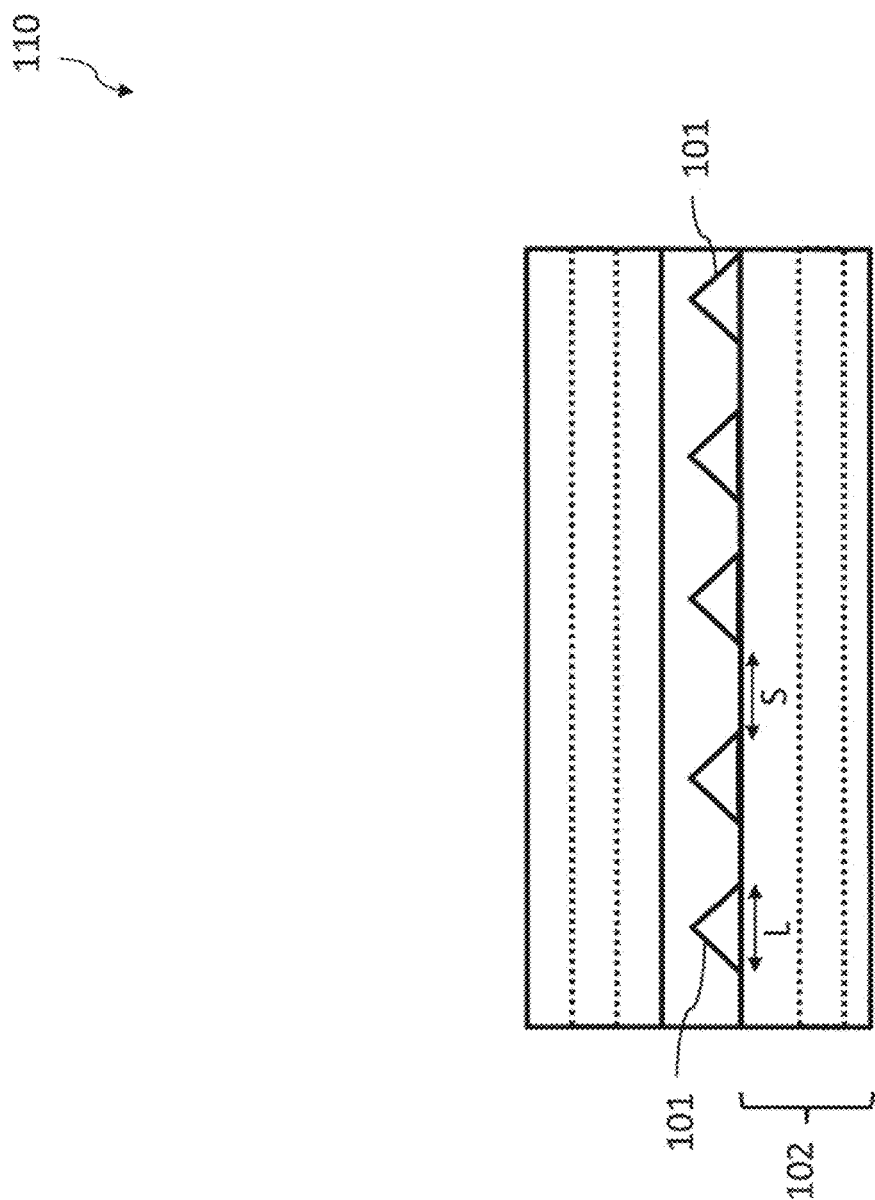
FIG. 1B shows a schematic illustration of a further semiconductor device according to an embodiment.

FIG. 1B shows a schematic illustration of a further semiconductor device 110 according to an embodiment.

The semiconductor device 110 includes a plurality of quantum structures 101 formed on a first semiconductor layer structure 102. The quantum structures of the plurality of quantum structures 101 have a lateral dimension of less than 15 nm. The plurality of quantum structures include germanium and antimony. The plurality of quantum structures are configured to emit light with a light emission maximum at a wavelength of between 5 μm and 7 μm or to absorb light with a light absorption maximum at a wavelength of between 5 μm and 7 μm.

Due to the quantum structures of the plurality of quantum structures 101 having a lateral dimension of less than 15 nm, a semiconductor device capable of emitting or absorbing light at wavelengths of importance for sensing and chemical imaging may be achieved or improved, for example. For example, the semiconductor device may be capable of sensing and chemical imaging in the automotive industry, of environmental sensing in factories and buildings and of humidity sensing. Furthermore, the semiconductor device may be capable of night vision, tomography or optical and digital imaging, for example.

The semiconductor device 110 may be similar to the semiconductor device described with respect to FIG. 1A. For example, the semiconductor device 110 may include one or more or all of the features described with respect to the semiconductor device of FIG. 1A.

More details and aspects are mentioned in connection with the embodiments described above or below. The embodiments shown in FIG. 1B may comprise one or more optional additional features corresponding to one or more aspects mentioned in connection with the proposed concept or one or more embodiments described above (e.g. FIG. 1A) or below (e.g. FIGS. 1C to 7).

Figure 1C:
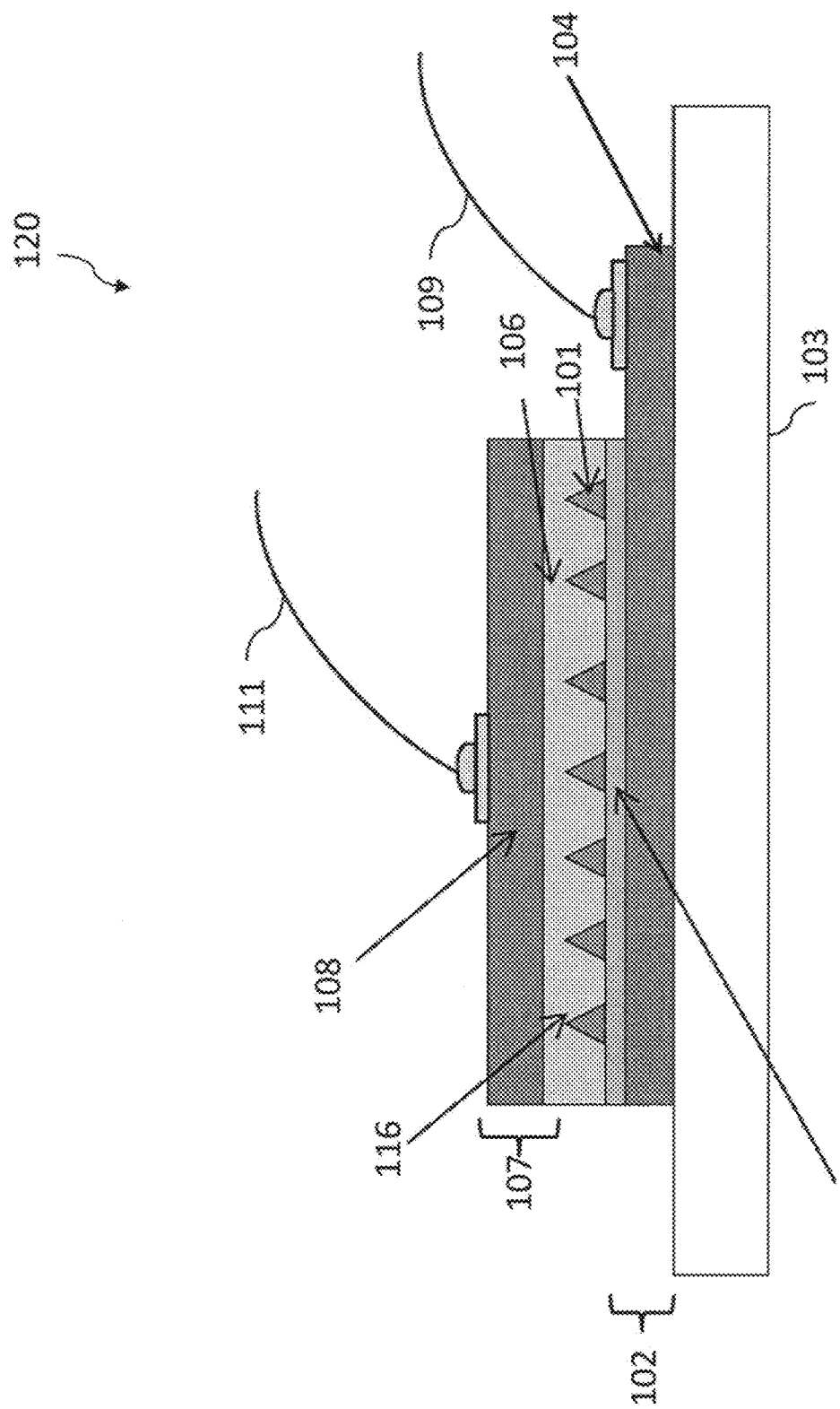
FIG. 1C shows a schematic illustration of a further semiconductor device arranged on a substrate according to an embodiment.

FIG. 1C shows a schematic illustration of a further semiconductor device 120 according to an embodiment.

The semiconductor device 120 may include the first semiconductor layer structure 102 formed on (e.g. directly on) the semiconductor substrate 103. The first semiconductor layer structure 102 may include the first silicon sub-layer 104 arranged directly over the semiconductor substrate 103. The first semiconductor layer structure 102 may include (optionally) the first silicon buffer sub-layer 105 arranged directly over the first silicon sub-layer 104.

The semiconductor device 120 may include the plurality of quantum structures 101 grown directly on the first silicon buffer sub-layer 105. The plurality of quantum structures 101 may be a plurality of quantum dots comprising predominantly germanium (Ge dots) formed in a layer on the first silicon buffer sub-layer 105, for example.

The semiconductor device 120 may include the second semiconductor layer structure 107 formed on the plurality of quantum structures 101. The second semiconductor layer structure 107 may include the intrinsic silicon spacer layer 106 covering the plurality of quantum structures 101. The plurality of quantum structures 101 and the covering intrinsic silicon spacer layer 106 may be referred to (collectively) as a quantum structure layer stack 116 (or a i-Si/Ge QD layer).

The second semiconductor layer structure 107 may further include the first silicon sub-layer 108 of the second semiconductor layer structure.

Optionally, the first silicon sub-layer 104 of the first semiconductor layer structure may have a doping of the first conductivity type (e.g. a p-type doping or p-Si) and the first silicon sub-layer 108 of the second semiconductor layer structure may have a doping of the second conductivity type (e.g. a n-type doping or n-Si). In this case, the semiconductor device (100, 110 or 120) may be a p-i-n device or have a p-i-n structure, for example.

Optionally or alternatively, the first silicon sub-layer 104 of the first semiconductor layer structure may have a doping of the first conductivity type (e.g. a p-type doping) and the first silicon sub-layer 108 of the second semiconductor layer structure may have a doping of the first conductivity type (e.g. a p-type doping). In this case, the semiconductor device (100, 110 or 120) may be a p device or have a p structure, for example.

Optionally or alternatively, the first silicon sub-layer 104 of the first semiconductor layer structure may have a doping of the second conductivity type (e.g. an n-type doping). and the first silicon sub-layer 108 of the second semiconductor layer structure may have a doping of the second conductivity type (e.g. an n-type doping). In this case, the semiconductor device (100, 110 or 120) may be an n device or have an n structure, for example.

The layer structure (e.g. the p-i-n structure, the p structure and the n structure) may be a simple and easily implementable structure used in mid-infrared (MIR) sources and detectors employing Ge based nanostructures, for example.

Additionally, alternatively or optionally, the semiconductor device (100, 110 or 120) may include a first electrical contact structure 109 in electrical contact with the first semiconductor layer structure 102, and a second electrical contact structure 111 in electrical contact with the second semiconductor layer structure 107. FIG. 1C shows a layout of the semiconductor device with the germanium quantum dots, for example.

The plurality of quantum structures may be configured to emit light with a light emission maximum at a wavelength of between 5 μm and 7 μm or to absorb light with a light absorption maximum at a wavelength of between 5 μm and 7 μm based on a voltage applied to the first electrical contact structure 109 and the second electrical contact structure 111. For example, the applied voltage applied to each of the first electrical contact structure 109 and the second electrical contact structure 111 may lie between 1 V and 10 V. Optionally, the voltage applied between the first electrical contact structure 109 and the second electrical contact structure 111 may lie between 1 V and 10 V, for example.

More details and aspects are mentioned in connection with the embodiments described above or below. The embodiments shown in FIG. 1C may comprise one or more optional additional features corresponding to one or more aspects mentioned in connection with the proposed concept or one or more embodiments described above (e.g. FIG. 1A to 1B) or below (e.g. FIGS. 1D to 7).

Figure 1D:
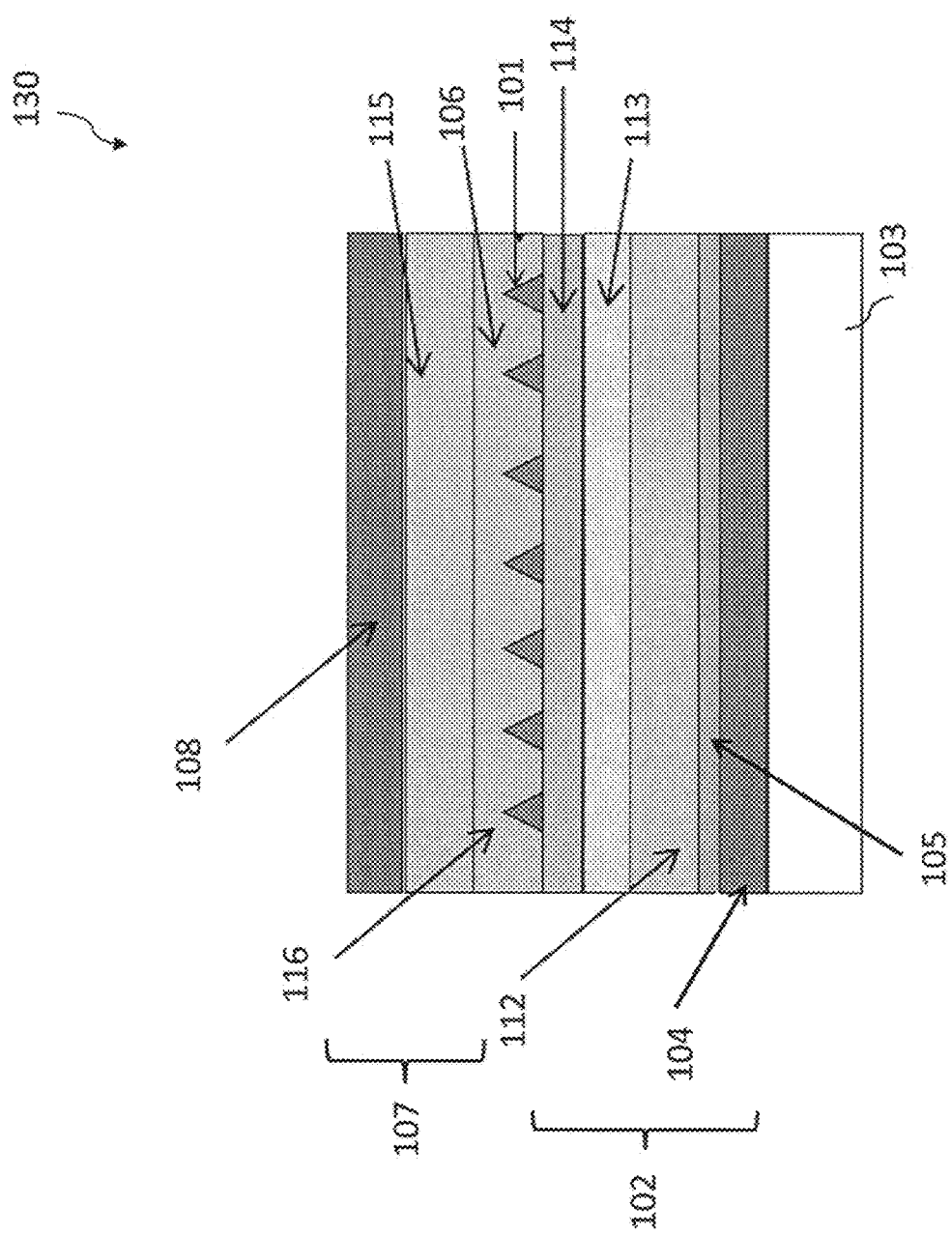
FIG. 1D shows a schematic illustration of a further semiconductor device comprising a first semiconductor layer structure according to an embodiment.

FIG. 1D shows a schematic illustration of a further semiconductor device 130 according to an embodiment.

The semiconductor device 130 may be similar to the semiconductor devices described with respect to FIGS. 1A to 1C. For example, the semiconductor device 130 may include one or more or all of the features described with respect to the semiconductor device of FIGS. 1A to 1C.

The first semiconductor layer structure 102 may include the first silicon sub-layer 104. The first semiconductor layer structure 102 may further include the first intrinsic silicon sub-layer 112 of the first semiconductor layer structure. The first semiconductor layer structure 102 may further include the highly-doped silicon sub-layer 113. The first semiconductor layer structure 102 may further include the seed sub-layer 114 including silicon-germanium or silicon doped with antimony or boron.

The second semiconductor layer structure 107 may include the intrinsic silicon spacer layer 106 covering the plurality of quantum structures 101. The second semiconductor layer structure 107 may further include the first silicon sub-layer 108 of the second semiconductor layer structure. The second semiconductor layer structure 107 may further include a second intrinsic silicon spacer layer 115 arranged between the first silicon sub-layer 108 and the (first) intrinsic silicon spacer layer 106, for example.

The semiconductor device 130 may include at least one quantum structure layer stack 116 formed (repeatedly) over the first semiconductor layer structure 102. For example, the at least one quantum structure layer stack 116 may be formed directly on the first silicon buffer sub-layer 105 of the first semiconductor layer structure 102 or directly on the first silicon sub-layer 104 of the first semiconductor layer structure 102, or directly on the first intrinsic silicon sub-layer 112 of the first semiconductor layer structure 102, for example.

A (or each) quantum structure layer stack 116 (of a plurality of quantum structure layer stacks) may include at least the intrinsic silicon spacer layer 106 and the plurality of quantum structures 101. The top most intrinsic silicon spacer layer 106 covering the plurality of quantum structures 101 may be referred to as a silicon cap layer 106 (cap).

Optionally, a (or each) quantum structure layer stack of the plurality of quantum structure layer stacks 116 may further include the highly-doped silicon sub-layer 113 of the first semiconductor layer structure, the seed sub-layer 114 of the first semiconductor layer structure and the second intrinsic silicon spacer layer 115 of the second semiconductor layer structure.

In the quantum structure layer stack, the seed sub-layer 114 of the first semiconductor layer structure may be arranged on (e.g. directly on) the highly-doped silicon sub-layer 113, for example. The plurality of quantum structures 101 may be arranged on (e.g. directly on) the seed sub-layer 114 of the first semiconductor layer structure, for example. The intrinsic silicon spacer layer 106 may cover the plurality of quantum structures 101 grown on the seed sub-layer 114 of the first semiconductor layer structure, for example. Optionally, the second intrinsic silicon spacer layer 115 of the second semiconductor layer structure may be arranged directly on the (first) intrinsic silicon spacer layer 106 of the second semiconductor layer structure.

Optionally, the highly-doped silicon sub-layer 113 of the first semiconductor layer structure may be arranged on (e.g. directly on) the first intrinsic silicon sub-layer 112 of the first semiconductor layer structure.

Optionally, the highly doped silicon sub-layer 113 and the seed sub-layer 114 of the first semiconductor layer structure 102 may be part of a silicon-on-insulator (SOI) layer stack of (or on) the semiconductor substrate 103. For example, the SOI layer stack may include an insulator layer (e.g. a silicon dioxide layer) formed below the highly doped silicon sub-layer 113, for example. In this case of an SOI structure, the first intrinsic silicon sub-layer 112 of the first semiconductor layer structure 102 and the first silicon buffer sub-layer 105 of the first semiconductor layer structure 102 may be optionally omitted, for example.

More details and aspects are mentioned in connection with the embodiments described above or below. The embodiments shown in FIG. 1D may comprise one or more optional additional features corresponding to one or more aspects mentioned in connection with the proposed concept or one or more embodiments described above (e.g. FIGS. 1A to 1C) or below (e.g. FIGS. 1E to 7).

Figure 1E:
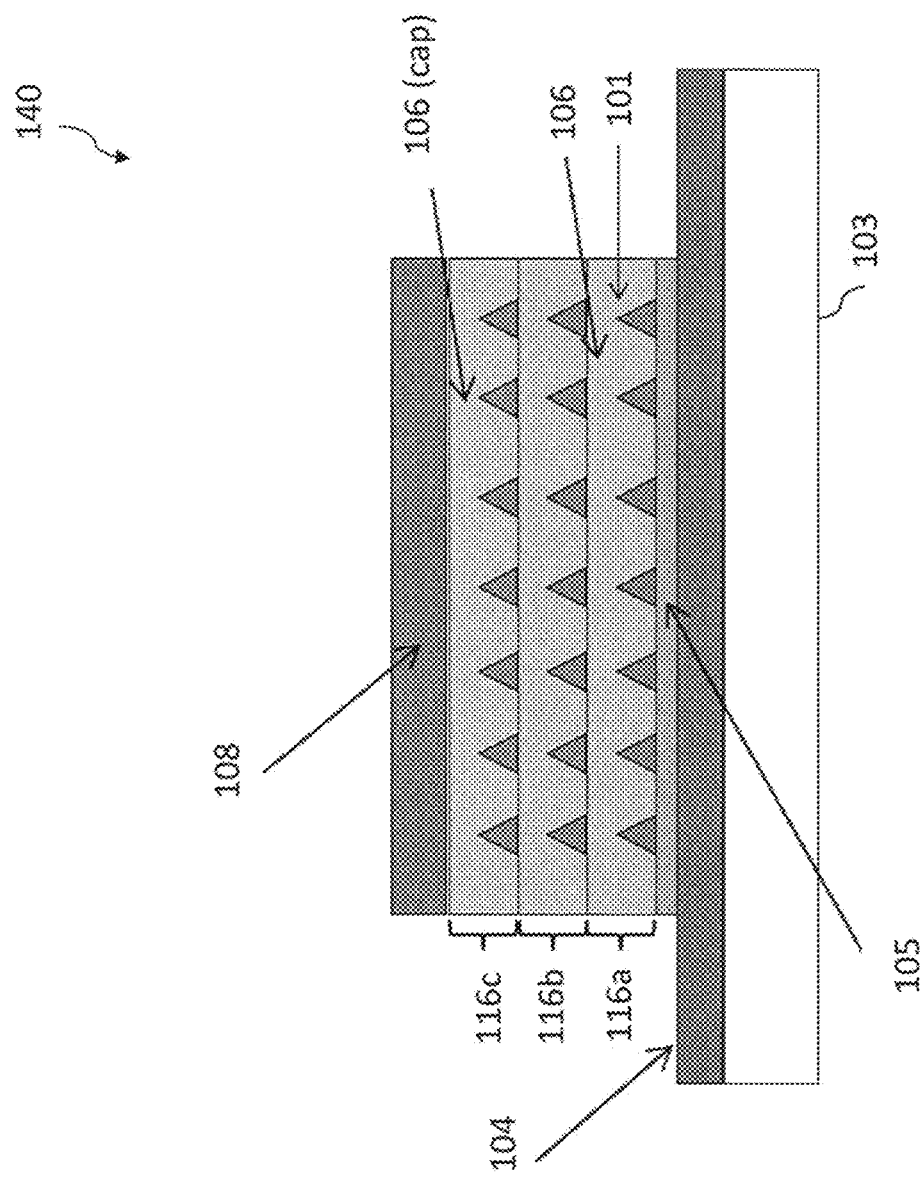
FIG. 1E shows a schematic illustration of a further semiconductor device comprising a plurality of quantum structure layer stacks according to an embodiment.

FIG. 1E shows a schematic illustration of a further semiconductor device 140 comprising a plurality of quantum structure layer stacks according to an embodiment.

The semiconductor device 140 may be similar to the semiconductor devices described with respect to FIGS. 1A to 1D. For example, the semiconductor device 140 may include one or more or all of the features described with respect to the semiconductor device of FIGS. 1A to 1D.

The semiconductor device 140 may include a plurality of quantum structure layer stacks 116a, 116b formed repeatedly (e.g. progressively stacked or e.g. one layer stack formed over another layer stack) over the first semiconductor layer structure 102. For example, the plurality of quantum structure layer stacks 116 may be formed directly on the first silicon buffer sub-layer 105.

The semiconductor device 140 may include more than one quantum structure layer stack, for example. The semiconductor device 140 may include between 10 to 100 quantum structure layer stacks (or e.g. between 20 to 80 quantum structure layer stacks or e.g. between 30 to 60 quantum structure layer stacks), for example.

The several (or plurality of) layers of Ge quantum dots may increase the intensity of the emission of light (by an emitter comprising the semiconductor device) or absorption of light (from a detector comprising the semiconductor device), for example.

The semiconductor device 140 may be a p-i-n structure, a p-structure or an n-structure, for example.

More details and aspects are mentioned in connection with the embodiments described above or below. The embodiments shown in FIG. 1E may comprise one or more optional additional features corresponding to one or more aspects mentioned in connection with the proposed concept or one or more embodiments described above (e.g. FIGS. 1A to 1D) or below (e.g. FIGS. 2A to 7).

Figure 2A:
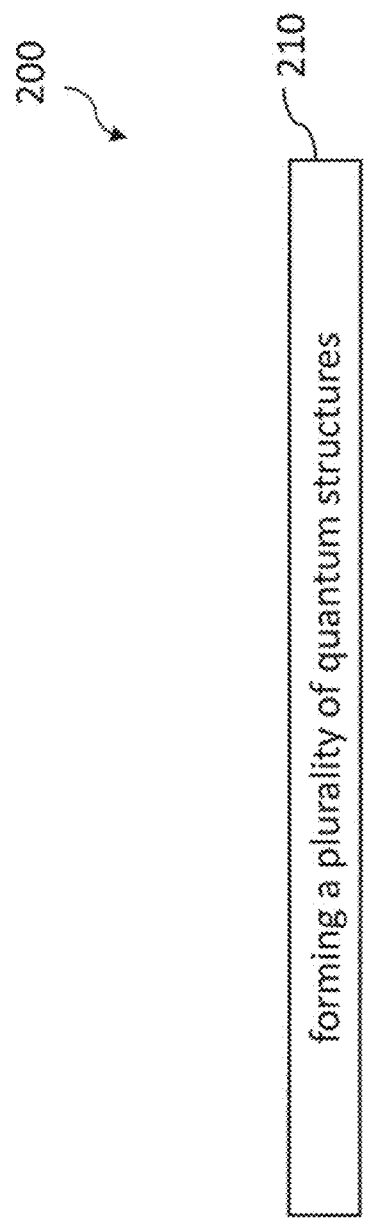
FIG. 2A shows a flow chart of a method for forming a semiconductor device according to an embodiment.

FIG. 2A shows a flow chart of a method 200 for forming a semiconductor device according to an embodiment.

The method 200 includes forming 210 a plurality of quantum structures including predominantly germanium on a first semiconductor layer structure. The quantum structures of the plurality of quantum structures have a lateral dimension of less than 15 nm and an area density of at least $1 \times 10^{10}$ quantum structures per $cm^2$. The plurality of quantum structures are configured to emit light with a light emission maximum at a wavelength of between 2 μm and 10 μm or to absorb light with a light absorption maximum at a wavelength of between 2 μm and 10 μm. The plurality of quantum structures are grown at least by using low pressure chemical vapor deposition.

Due to using low pressure chemical vapor deposition to form the plurality of quantum structures 101 having a lateral dimension of less than 15 nm and an area density of at least $1 \times 10^{10}$ quantum structures per $cm^2$, a semiconductor device capable of emitting or absorbing light at wavelengths of importance for sensing and chemical imaging may be achieved or improved, for example.

The method 200 may further include forming 210 a first semiconductor layer structure before forming the plurality of quantum structures. The first silicon sub-layer of the first semiconductor structure may be formed on the semiconductor substrate (e.g. a Si substrate or e.g. a $Si_3N_4$ substrate). For example, the first silicon sub-layer may be an n-type epitaxial or monocrystalline layer doped with phosphor atoms, arsenic atoms or antimony atoms. This layer may serve as or be a power supply layer for the Ge quantum dot structures.

The plurality of quantum structures may be grown at least by using low pressure chemical vapor deposition (LPCVD), for example. The plurality of quantum structures (e.g. the Ge quantum dot structures) may be grown in a LPCVD reactor, for example. Therefore, an area density of at least $1 \times 10^{10}$ quantum structures per $cm^2$ (or at least $8 \times 10^{11}$ quantum structures per $cm^2$) may be achieved. These high densities of quantum structures may be achieved by using chemical vapor deposition for growth, for example. Other growth methods (e.g. molecular beam epitaxy) may achieve lower densities (e.g. between $1 \times 10^8$ or $2 \times 10^8$ quantum structures per $cm^2$ to $3 \times 10^{11}$ or $4 \times 10^{11}$ quantum structures per $cm^2$). The density may be made intentionally much lower than $1 \times 10^8$ or $2 \times 10^8$ quantum structures per $cm^2$ (e.g. for ordered arrays of Ge quantum dots or for low density growth). These higher densities (e.g. above $3 \times 10^{11}$ or $4 \times 10^{11}$ quantum structures per $cm^2$) may be achieved when chemical vapor deposition is used for growth.

The method 200 may include providing a gaseous germanium precursor at a surface of the first semiconductor layer structure at a temperature of between 550° to 700° to form the plurality of quantum structures (e.g. in an LPCVD process). The germanium precursor may include $GeH_4$ or germanium tetrachloride (GeCl4) in Hydrogen carrier gas. The germanium precursor may be passed or conducted over the wafer (or over the first semiconductor layer structure) at a low pressure of under 30 Torr.

The method 200 may include subsequently (a process without separation) providing hydrogen gas so that the deposited germanium may form or be redistributed to isolated germanium crystallites (e.g. quantum dots comprising predominantly germanium) with a diameter (or lateral dimension) of between 5 nm and 20 nm (or e.g. less than 15 nm), for example.

The method 200 may further (optionally) include forming a layer of antimony on a plurality of germanium structures (e.g. the germanium crystallites) after providing the gaseous germanium precursor, and heating the plurality of germanium structures (to a temperature between 100° to 200°, so that the antimony interdiffuses with the germanium to form the plurality of quantum structures. The layer of antimony may have a thickness of less than 5 nm, for example.

The plurality of quantum structures formed may be self-assembled quantum structures and may have the area density of at least $8 \times 10^{11}$ quantum structures per $cm^2$. The quantum structures may be homogenous in size. For example, 80 to 90% of the quantum structures may have a lateral dimension which lies between 10 nm and 15 nm.

The method 200 may include subsequently (in a following process step) forming the intrinsic silicon spacer layer of the second semiconductor layer structure to cover the plurality of quantum structures. For example, the crystallites of germanium may be covered with silicon (e.g. the first intrinsic silicon spacer layer of the second semiconductor layer structure). To form the first intrinsic silicon spacer layer of the second semiconductor layer structure, a silicon precursor such as silane ($SiH_4$), disilane ($Si_2H_6$) or dichlorosilane ($SiH_2Cl_2$) in a hydrogen carrier gas may be applied or provided. The temperature may be similar to the temperature provided for growing the germanium crystallites, for example. For example, the temperature may be between 550° to 700°. The pressure may lie between 10 and 200 Torr, for example.

The layer thickness of the silicon layer (e.g. the thickness of the first intrinsic silicon spacer layer of the second semiconductor layer structure) may (or should) provide a sufficient quantum mechanical coupling with the plurality of quantum structures (e.g. the quantum dots comprising predominantly germanium), and lies in the range of the diameter (or lateral dimension of the germanium crystallites.

The process (of forming a quantum structure layer stack including at least the plurality of quantum structures and the first intrinsic silicon spacer layer of the second semiconductor layer structure) may be repeated periodically so that at least one (e.g. one or more) further depositions of germanium quantum dots and the covering silicon layer may be carried out. The process may be repeated until a sufficient or acceptable number of quantum structure layer stacks layers are formed or arranged over each other, For example, until a sufficient emission of infrared light or a sufficient sensitivity of a detector can be achieved.

More details and aspects are mentioned in connection with the embodiments described above or below. The embodiments shown in FIG. 2A may comprise one or more optional additional features corresponding to one or more aspects mentioned in connection with the proposed concept or one or more embodiments described above (e.g. FIGS. 1A to 1D) or below (e.g. FIGS. 2B to 7).

Figure 2B:
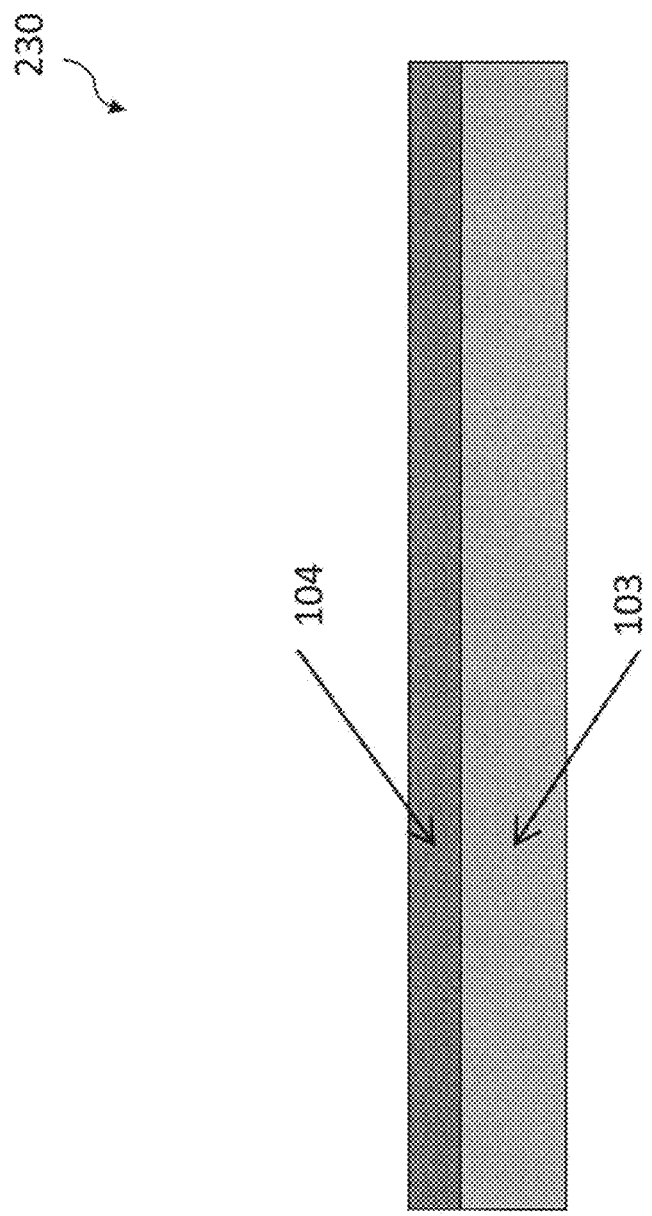
FIGS. 2B to 2E show a schematic illustration of a method for forming a semiconductor device according to an embodiment.

FIG. 2B shows a schematic illustration 230 of forming part of a first semiconductor layer structure on the semiconductor substrate 103 (as described in 210), for example. For example, the first silicon sub-layer 104 of the first semiconductor layer structure may be an n-type epitaxial or monocrystalline layer doped with phosphor atoms, arsenic atoms or antimony atoms. Silicon oxide (SiOx) or Tetraethyl orthosilicate (TEOS) may (or must) be completely canceled out (e.g. removed) due to the absorption losses, for example.

More details and aspects are mentioned in connection with the embodiments described above or below. The embodiments shown in FIG. 2B may comprise one or more optional additional features corresponding to one or more aspects mentioned in connection with the proposed concept or one or more embodiments described above (e.g. FIGS. 1A to 2A) or below (e.g. FIGS. 2C to 7).

Figure 2C:
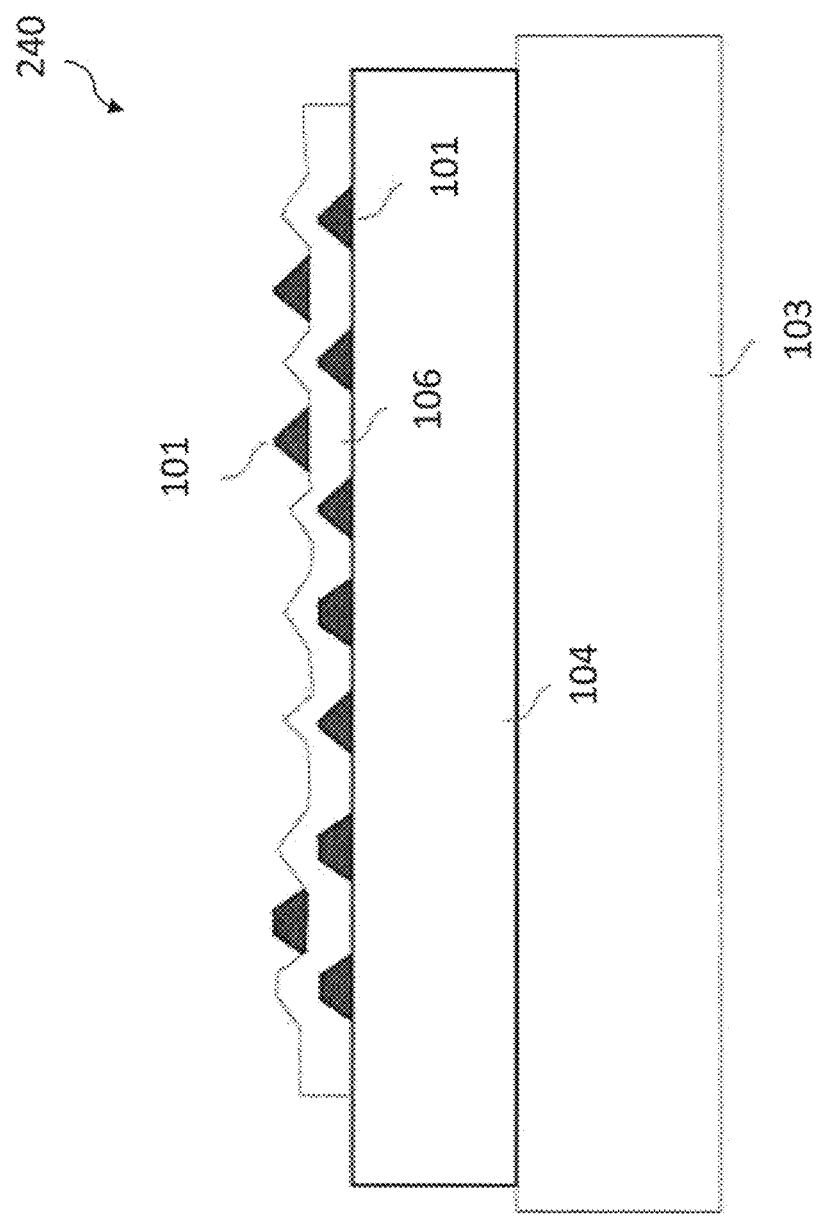

FIG. 2C shows a schematic illustration 240 of (subsequently) forming at least one (e.g. a plurality) quantum structure layer stack comprising a plurality of quantum structures 101 (quantum dots comprising predominantly germanium), and further forming the covering intrinsic silicon spacer layer 106 over the plurality of quantum structures 101. The plurality of quantum structure layer stacks may be formed on the first silicon sub-layer 104 of the first semiconductor layer structure, which may be formed on the semiconductor substrate 103, for example.

More details and aspects are mentioned in connection with the embodiments described above or below. The embodiments shown in FIG. 2C may comprise one or more optional additional features corresponding to one or more aspects mentioned in connection with the proposed concept or one or more embodiments described above (e.g. FIGS. 1A to 2B) or below (e.g. FIGS. 2D to 7).

Figure 2D:
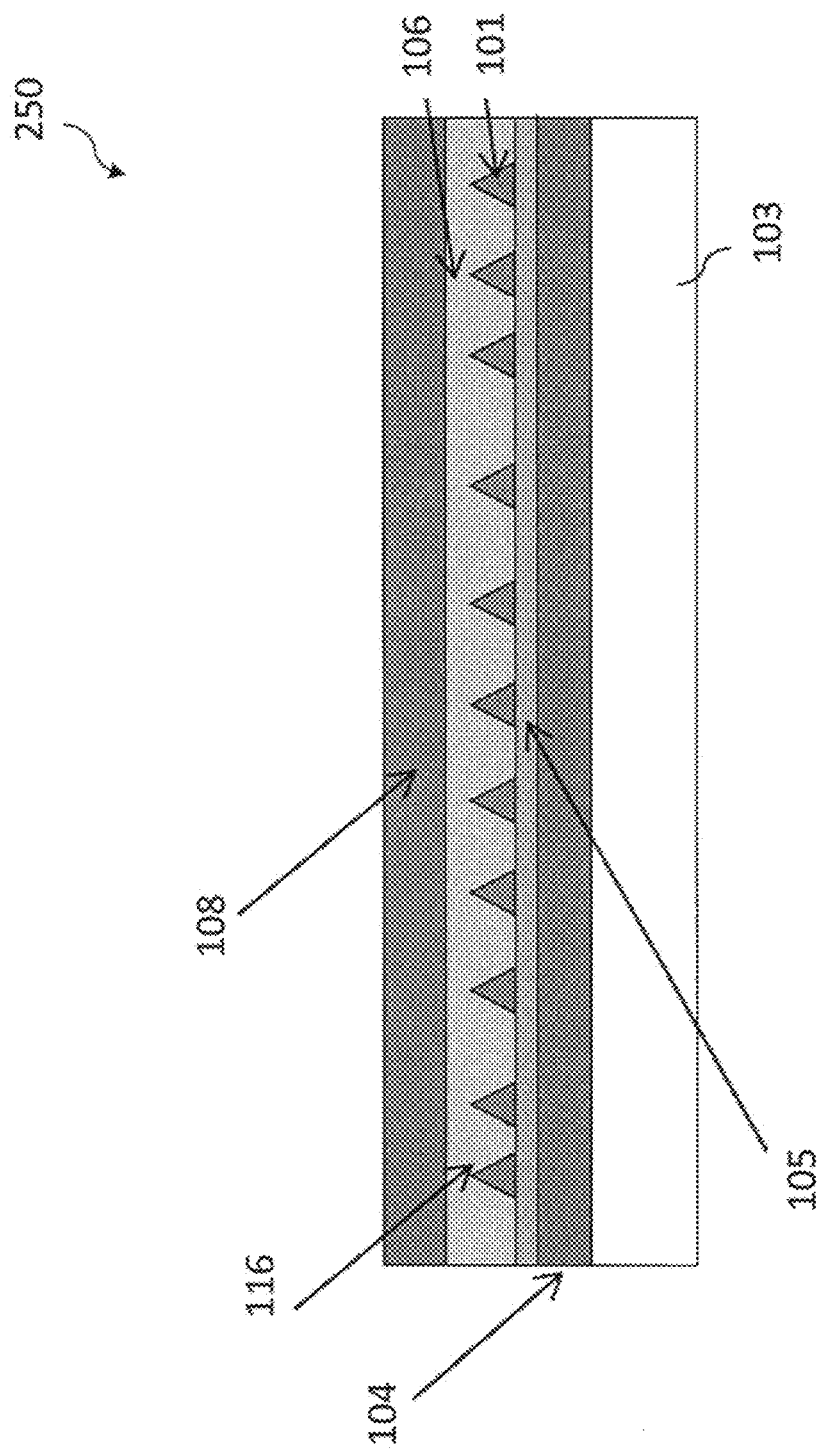

FIG. 2D shows a schematic illustration 250 of (subsequently) forming the first silicon sub-layer 108 of the second semiconductor layer structure over the at least one quantum structure layer stack 116 comprising the intrinsic silicon spacer layer 106 and the plurality of quantum structures 101. The schematic illustration shows the growth of the layer structure, for example.

More details and aspects are mentioned in connection with the embodiments described above or below. The embodiments shown in FIG. 2D may comprise one or more optional additional features corresponding to one or more aspects mentioned in connection with the proposed concept or one or more embodiments described above (e.g. FIGS. 1A to 2C) or below (e.g. FIGS. 2E to 7).

Figure 2E:
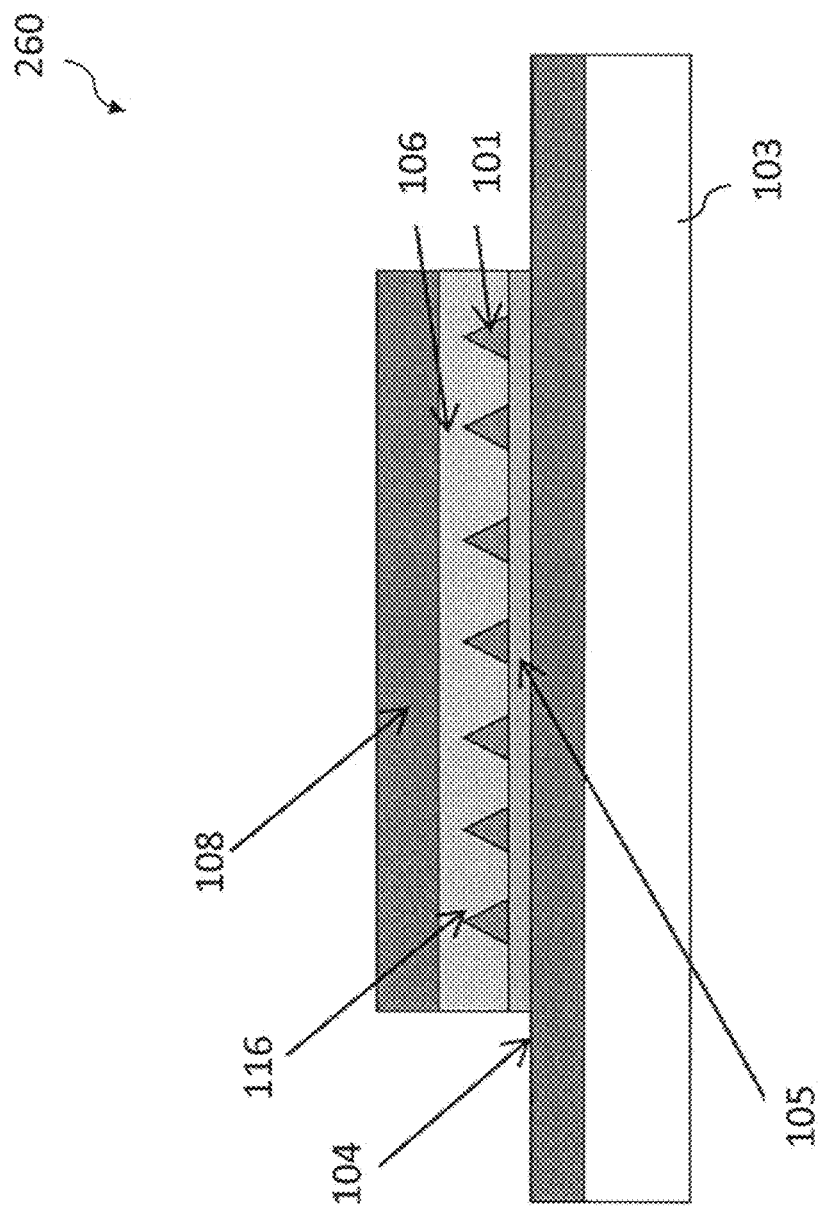

FIG. 2E shows a schematic illustration 260 of device processing, (e.g. lithography, etching or metallization) to form a semiconductor device including the at least one quantum structure layer stack 116. Device processing may include structuring or shaping the layers of the semiconductor device (e.g. the first silicon buffer sub-layer 105, the intrinsic silicon spacer layer 106 and the first silicon sub-layer 108). Furthermore, electrical contacts may be formed on exposed regions of the first semiconductor layer structure 102 and on the second semiconductor layer structure 107, for example.

More details and aspects are mentioned in connection with the embodiments described above or below. The embodiments shown in FIG. 2E may comprise one or more optional additional features corresponding to one or more aspects mentioned in connection with the proposed concept or one or more embodiments described above (e.g. FIGS. 1A to 2D) or below (e.g. FIGS. 3A to 7).

Figure 3A:
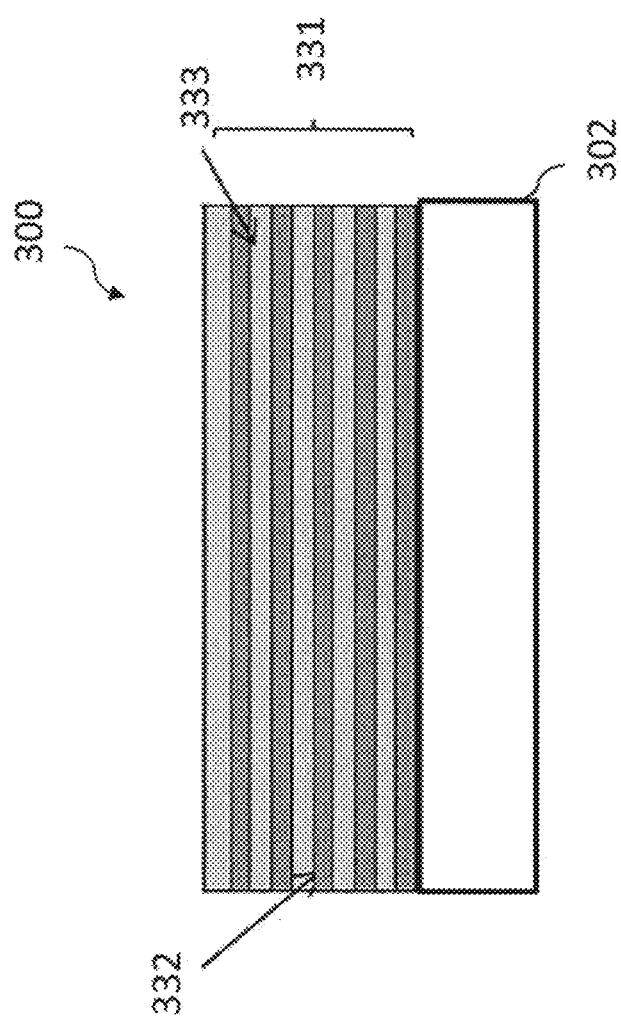
FIG. 3A shows a schematic illustration of a semiconductor device comprising a quantum well layer stack according to an embodiment.

FIG. 3A shows a schematic illustration of a further semiconductor device 300 according to an embodiment.

The semiconductor device 300 includes a quantum well layer stack 331. The quantum well layer stack 331 includes a plurality of first quantum well layers 332 and a plurality of second quantum well layers 333. The first quantum well layers of the plurality of first quantum well layers 332 and the second quantum well layers of the plurality of second quantum well layers 333 are arranged alternatingly on a first semiconductor layer structure 302. The first quantum well layers of the plurality of first quantum well layers 332 include silicon-germanium and the second quantum well layers of the plurality of second quantum well layers 333 include silicon. The first quantum well layers of the plurality of first quantum well layers 332 and the second quantum well layers of the plurality of second quantum well layers 333 have a thickness of below 100 nm. The quantum well layer stack 331 is configured to emit light with a light emission maximum at a wavelength of between 2 μm and 10 μm or to absorb light with a light absorption maximum at a wavelength of between 2 μm and 10 μm.

Due to the quantum well layer stack 331 being configured to emit light with a light emission maximum at a wavelength of between 2 μm and 10 μm or to absorb light with a light absorption maximum at a wavelength of between 2 μm and 10 μm, a semiconductor device capable of emitting or absorbing light at wavelengths of importance for sensing and chemical imaging may be achieved or improved, for example. For example, the semiconductor device 300 may be capable of sensing and chemical imaging in the automotive industry, of environmental sensing in factories and buildings and of humidity sensing. Furthermore, the semiconductor device 300 may be capable of night vision, tomography or optical and digital imaging, for example.

A (or each) first quantum well layer of the plurality of first quantum well layers 332 may include $silicon_x$-$germanium_{1-x}$. x may lie between 0.25 and 0.35, for example. A (or each) second quantum well layer of the plurality of second quantum well layers 333 may include intrinsic silicon, for example.

A (or each) first quantum well layer of the plurality of first quantum well layers 332 may have a thickness which lies between 1 nm and 100 nm (or e.g. between 1 nm and 10 nm), for example (e.g. 5 nm). A (or each) second quantum well layer of the plurality of second quantum well layers 333 may have a thickness which lies between 1 nm and 100 (or e.g. between 1 nm and 10 nm), for example (e.g. 5 nm). The thickness may be chosen in order to operate in the MIR range.

The quantum well layer stack 331 may include at least alternatingly arranged first quantum well layers 332 and second quantum well layers 333 (e.g. alternating Si and SiGe layers). For example, a second quantum well layer 333 may be arranged between consecutive first quantum well layers 332, and a first quantum well layer 332 may be arranged between consecutive second quantum well layers 333. The quantum well layer stack 331 may include at least three first quantum well layers and at least three second quantum well layers (e.g. at least 3 or 4 layers of Ge quantum wells).

The first semiconductor layer structure 302 may be similar to the first semiconductor layer structure 102, for example. For example, the first semiconductor layer structure 302 may include one or more or all of the features or layers described with respect to the first semiconductor layer structure 102.

More details and aspects are mentioned in connection with the embodiments described above or below. The embodiments shown in FIG. 3A may comprise one or more optional additional features corresponding to one or more aspects mentioned in connection with the proposed concept or one or more embodiments described above (e.g. FIGS. 1A to 2E) or below (e.g. FIGS. 3B to 7).

Figure 3B:
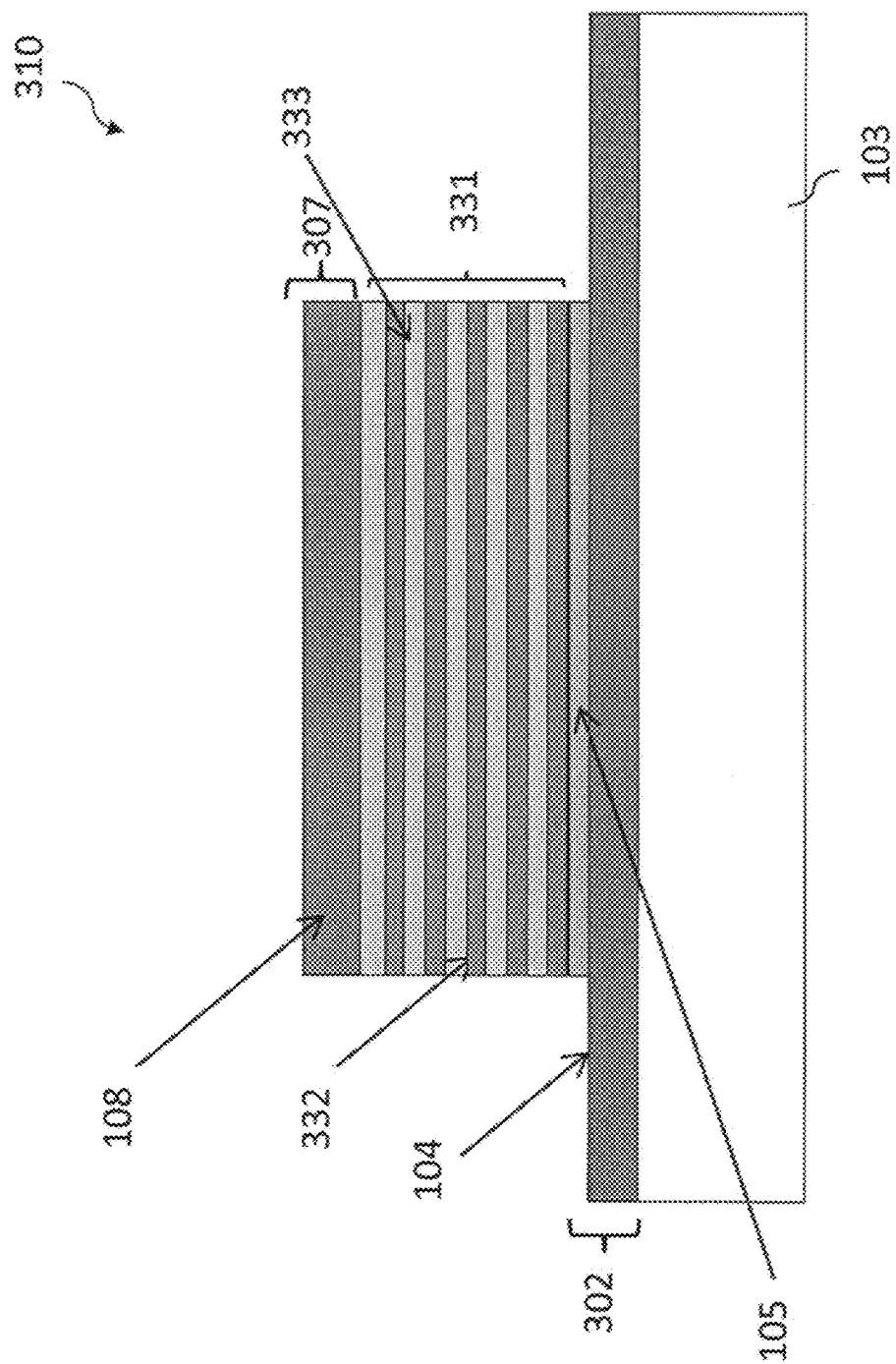
FIG. 3B shows a schematic illustration of a further semiconductor device comprising a quantum well layer stack according to an embodiment.

FIG. 3B shows a schematic illustration of a further semiconductor device 310 comprising a quantum well layer stack according to an embodiment.

The first semiconductor layer structure 302 may include one or more or all of the features or layers (e.g. the first silicon sub-layer 104 and optionally the first silicon buffer sub-layer 105) arranged on the semiconductor substrate 103.

The semiconductor device 310 may further include a second semiconductor layer structure 307 covering the quantum well layer stack 331. The second semiconductor layer structure 307 may include a first silicon sub-layer 108 formed on the quantum well layer stack 331, for example.

The second semiconductor layer structure 307 of semiconductor device 310 may be similar to the second semiconductor layer structure 107. For example, second semiconductor layer structure 307 may include one or more features described with respect to the second semiconductor layer structure 107.

The semiconductor device 310 may include a first electrical contact structure in electrical contact with the first semiconductor layer structure 302 (e.g. in electrical contact with a first silicon sub-layer 104 of the first semiconductor layer structure), and a second electrical contact structure in electrical contact with the second semiconductor layer structure 307 (e.g. in electrical contact with a first silicon sub-layer 108 of the second semiconductor layer structure).

The plurality of first quantum well layers 332 and the plurality of second quantum well layers 332 may be arranged (alternatingly) between the first semiconductor layer structure 302 and the second semiconductor layer structure 307, for example.

The quantum well layer stack 331 may be configured to emit light with a light emission maximum at a wavelength of between 2 μm and 10 μm (or e.g. between 5 μm and 7 μm) or to absorb light with a light absorption maximum at a wavelength of between 2 μm and 10 μm (or e.g. between 5 μm and 7 μm) based on a voltage applied to the first electrical contact and the second electrical contact, wherein the applied voltage lies between 1 V and 10 V, for example. Optionally, the voltage applied between the first electrical contact structure 109 and the second electrical contact structure 111 may lie between 1 V and 10 V, for example.

Additionally or optionally, tuning of the wavelength of the emission of light (of a source or emitter) or absorption of light (of a detector) may be done by varying (or controlling) a thickness of the first quantum well layer and a thickness of the second quantum well layer. Additionally or optionally, the applied voltage to a first electrical contact structure and a second electrical contact structure (e.g. to the p and/or n contacts) may be varied to control or tune the emission or absorption wavelength. Additionally or optionally, the content of silicon of the silicon-germanium layer (x) may be varied during growth.

More details and aspects are mentioned in connection with the embodiments described above or below. The embodiments shown in FIG. 3B may comprise one or more optional additional features corresponding to one or more aspects mentioned in connection with the proposed concept or one or more embodiments described above (e.g. FIGS. 1A to 3A) or below (e.g. FIGS. 3C to 7).

Figure 3C:
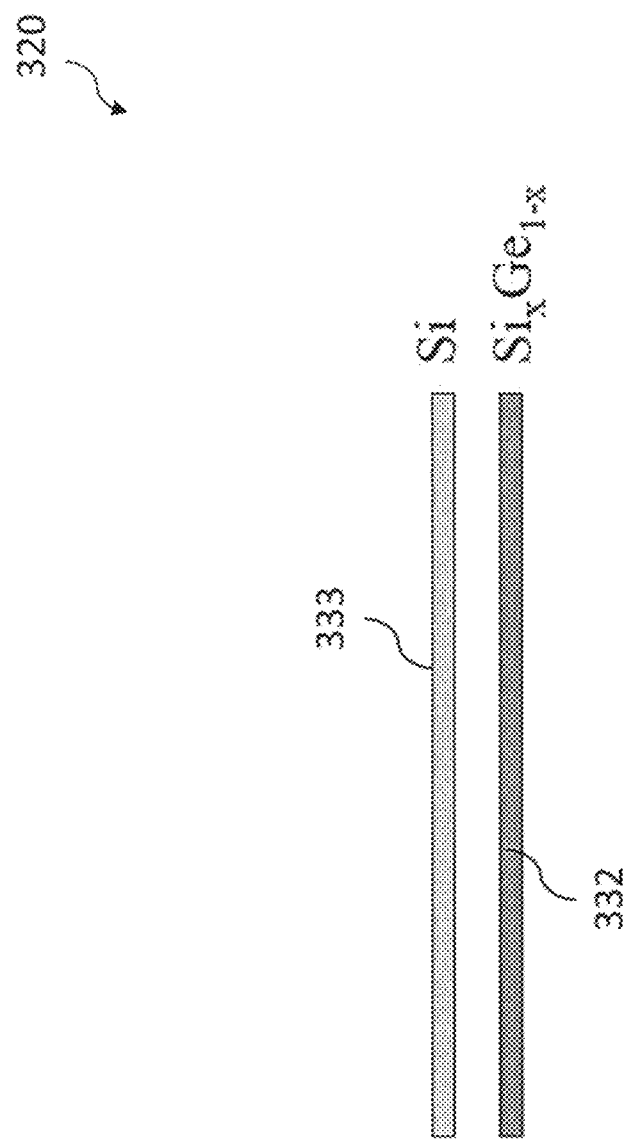
FIG. 3C shows a schematic illustration of part of the quantum well layer stack of a semiconductor device according to an embodiment.

FIG. 3C shows a schematic illustration of part of the quantum well layer stack 320 of the semiconductor device.

The quantum well layer stack 320 includes the first quantum well layer 332 (e.g. silicon$_x$-germanium$_{1-x}$ and the second quantum well layer 333 (e.g. Si), for example.

More details and aspects are mentioned in connection with the embodiments described above or below. The embodiments shown in FIG. 3C may comprise one or more optional additional features corresponding to one or more aspects mentioned in connection with the proposed concept or one or more embodiments described above (e.g. FIGS. 1A to 3B) or below (e.g. FIGS. 4 to 7).

Figure 4:
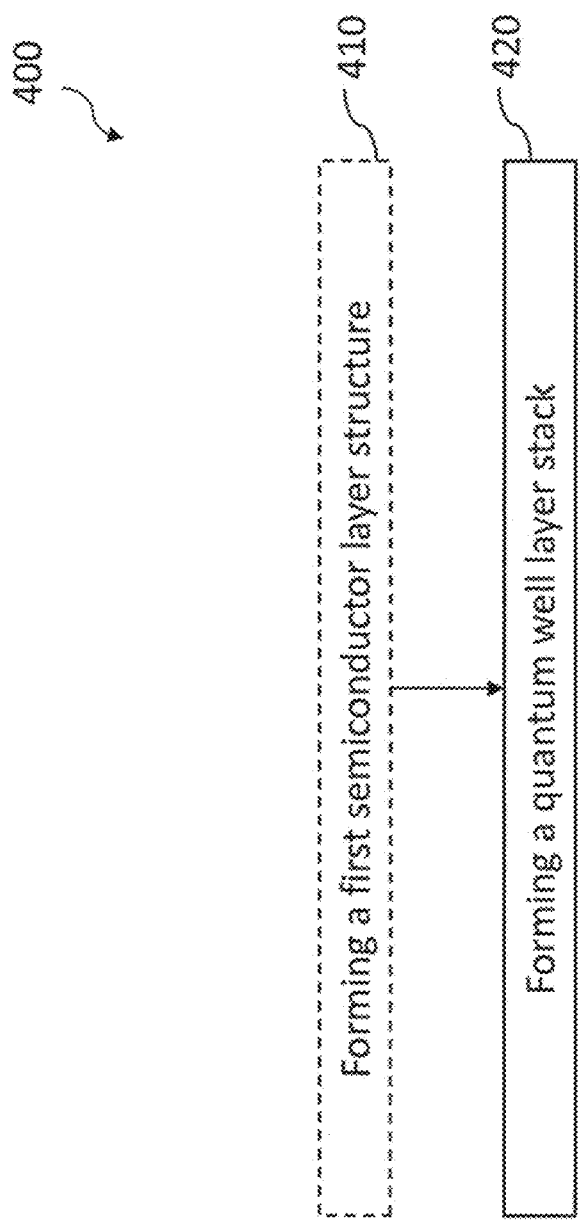
FIG. 4 shows a flow chart of a method for forming a semiconductor device according to an embodiment.

FIG. 4 shows a flow chart of a method 400 for forming a semiconductor device according to an embodiment.

The method 400 includes forming 420 a quantum well layer stack comprising a plurality of first quantum well layers and a plurality of second quantum well layers. The first quantum well layers of the plurality of first quantum well layers and the second quantum well layers of the plurality of second quantum well layers are arranged alternatingly on a semiconductor layer structure. The first quantum well layers of the plurality of first quantum well layers comprise silicon-germanium and the second quantum well layers of the plurality of second quantum well layers comprise silicon. The first quantum well layers of the plurality of first quantum well layers and the second quantum well layers of the plurality of second quantum well layers have a thickness of below 100 nm. The quantum well layer stack is configured to emit light with a light emission maximum at a wavelength of between 2 μm and 10 μm or to absorb light with a light absorption maximum at a wavelength of between 2 μm and 10 μm.

By forming the quantum well layer stack comprising the plurality of first quantum well layers and the plurality of second quantum well layers, a semiconductor device capable of emitting or absorbing light at wavelengths of importance for sensing and chemical imaging may be achieved or improved, for example.

The method 400 may further include forming 410 a first semiconductor layer structure before forming the quantum well layer stack, for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1A to 3B) or below (e.g. FIGS. 5A to 7).

Figure 5A:
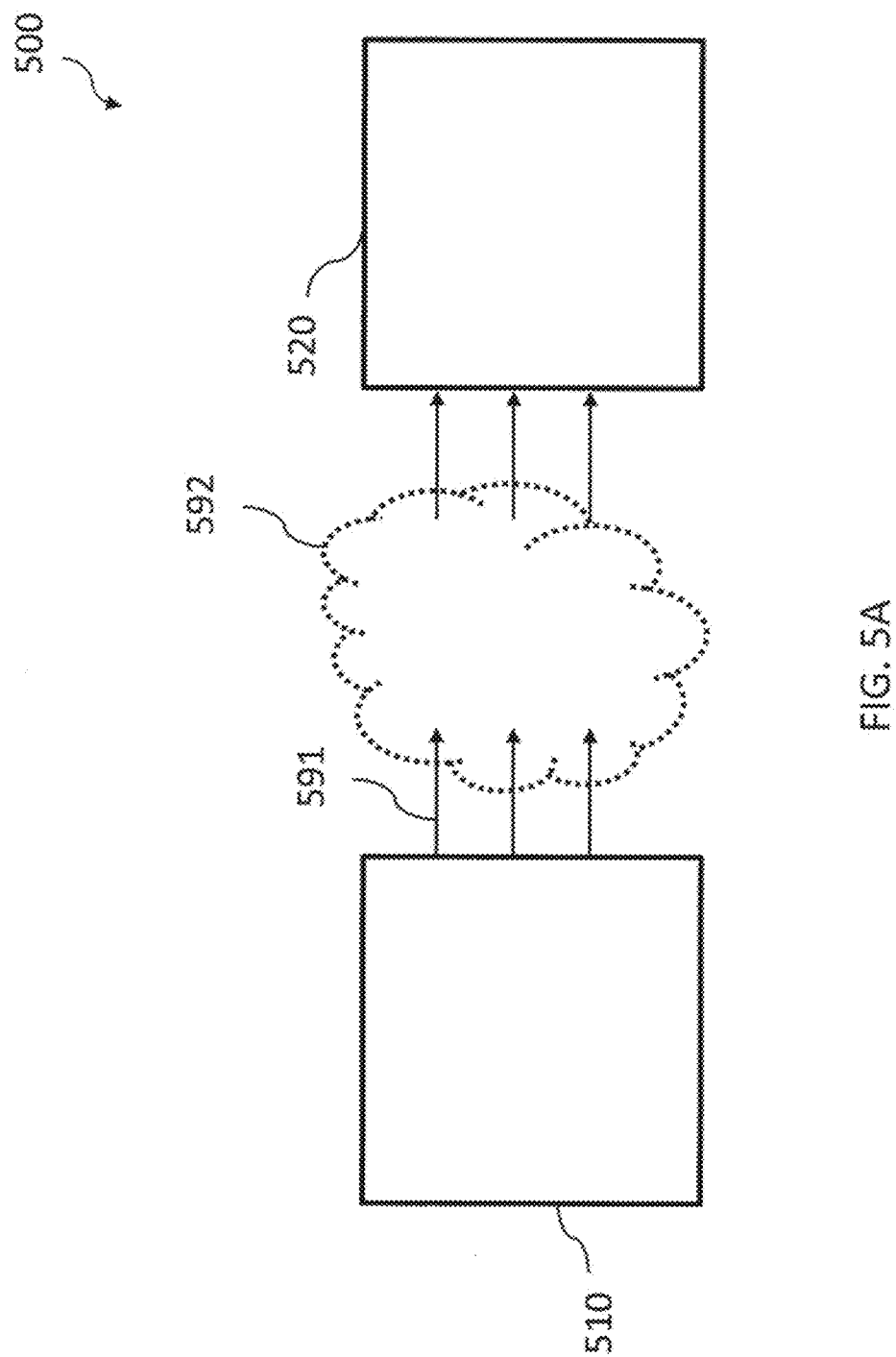

FIG. 5A shows a schematic illustration of a detection system 500 according to an embodiment.

The detection system 500 includes an emitter device 510 and a detector device 520. The emitter device 510 and the detector device 520 are arranged so that light emitted 591 by the emitter device 510 interacts with a substance 592 to be detected by the detector device 520 before reaching the detector device 520.

The emitter device 510 includes a semiconductor device described in connection with FIGS. 1A to 4, for example. For example, the emitter device 510 includes the plurality of quantum structures or quantum well layer stack comprising quantum well layers. The emitter device 510 may be a MIR source, configured to emit light with a light emission maximum at a wavelength of between 2 μm and 10 μm (or e.g. between 5 μm and 7 μm), for example.

The detector device 520 includes a semiconductor device described above, for example. For example, the emitter device 520 includes the plurality of quantum structures or quantum well layer stack comprising quantum well layers. The detector device 520 may be a MIR detector, configured to absorb light with a light absorption maximum at a wavelength of between 2 μm and 10 μm (or e.g. between 5 μm and 7 μm), for example.

The light emitted by the emitter device may interact with the substance 592 to be detected in an interaction volume or interaction space which lies between the emitter device 510 and the detector device 520, for example. The interaction volume may include or be a waveguide, a photonic crystal or a resonator structure, for example.

The detection system 500 may include or be a sensor for detecting carbon dioxide or machine oil, for example. The detection system 500 may include or be a night vision device, a tomography device, a digital imaging device or an optical imaging device, for example.

A MIR source and a MIR detector based on Ge or SiGe quantum dots and Ge or SiGe quantum wells may be referred to generally as Si/Ge nanostructures.

The source (e.g. the emitter device 510) and the detector (e.g. the detector device 520) may be fabricated from Si/Ge, which may allow for their full integration on a Si chip along with other Si/Ge based components, for example. In addition, the two components (source and detector) may be fully processed by Si technology. The Ge quantum dots and Ge quantum wells may be fabricated or grown by chemical vapor deposition (CVD), for example. The technique of CVD allows for high throughput at the required quality towards the structures, for example. The structures following after the growth may be fabricated by processes such as deep-UV lithography, chemical or reactive ion etching (RIE), and/or metal deposition. Thus, the entire detection system (e.g. which may include the source, a waveguide or photonic crystal PhC and a detector may be fabricated. The process flow for the device fabrication may be established on 200 mm-Si-wafer processes. The Si/Ge nanostructures may be made by selected growth at appropriate places on the Si wafer.

For example, the Si/Ge nanostructures may form a MIR source, which emits light at $\lambda=4.26$ μm, which coincides with the absorption peak of $CO_2$. The MIR detector, formed also from Si/Ge nanostructures may absorb light with peak sensitivity of the detector at $\lambda=4.26$ μm. The MIR source and the MIR detector may be placed on a Si chip along with a photonic crystal (PhC) structure between them. The three components (the MIR source, PhC and detector) may form a detection system (e.g. a sensor for CO2 sensing and detection), for example.

For example, the Si/Ge nanostructures may form a MIR source, which emits light at a longer wavelength of $\lambda=6.25$ μm, which coincides with the absorption peak of machine oil. The MIR detector, formed also from Si/Ge nanostructures, absorbs light with peak sensitivity of the detector at $\lambda=6.25$ μm. The MIR source and the MIR detector may be placed on a Si chip along with a waveguide (e.g. photonic crystal (PhC) structure) between them. The three components (the MIR source, PhC and detector) may form a detection system (e.g. a sensor for oil sensing and detection).

The excitation of the SiGe nanostructures, which makes them emit light, may be done optically by an excitation light beam (e.g. from a laser diode) or electrically (e.g. by application of a bias). For the optical excitation of the SiGe nanostructures in the emitter part, a grating structure may be designed on the surface of the structure, where the Ge quantum dots or Ge quantum wells reside, for example.

For the electrical excitation of the SiGe nanostructures in the semiconductor of the emitter device 510, the nanostructures may be grown in a p-n, a p-i-n or a p-junction, for example. Then, the bias to the structures may be applied via metal contacts to the junction, for example.

Developing a MIR source and a mid-infrared detector, which are compatible with the Si-based technology, may be of importance not only from the point of view of fundamental physics, but also from the point of view of numerous applications, particularly for optoelectronic and photonic devices.

An obstacle for development of such a source and detector is the indirect electronic band gap of bulk Si (silicon) and bulk Ge (germanium), which may make them inefficient emitter and detector of light. Recent progress of nanotechnology may allow the indirect nature of the band gap to be overcome and efficient emission and absorption of light may be achieved. This may be carried out by scaling down the Si and Ge and the designing of nanostructures, namely quantum dots (QDs) and quantum wells (QWs).

Although demonstrations may be manifested as laboratory concepts, commercially available MIR source and MIR detector based on Si/Ge are absent, and may not perform at the desired wavelengths. The devices may be fabricated by molecular beam lithography (MBE) (although they are not necessarily appropriate for the industry due to high costs and low throughput. The wavelengths of operation of some MIR sources and MIR detectors may fall below the wavelength $\lambda=4.26$ μm and the spectral range $\lambda=5$ μm to 7 μm.

The wavelength $\lambda=4.26$ μm may be used for detection carbon dioxide $CO_2$ as the gaseous phase of $CO_2$ possesses a high absorption peak exactly at this wavelength.

The spectral range of $\lambda=5$ to 7 μm may be used to detect several important liquids, which possess high absorption peaks in this range. For example, machine oil has peaks at $\lambda=5.75$ μm and $\lambda=6.25$ μm. Brake fluid and acetone has a peak at approximately $\lambda=5.8$ μm. Methanol has a strong peak at $\lambda=6.9$ μm although strongest peaks at $\lambda=3$ μm, $\lambda=3.4$ μm, $\lambda=3.53$ and $\lambda=9.7$ μm. Trichloroethylene has a peak at $\lambda=6.31$ μm. Water has a peak at $\lambda=6.1$ μm.

The wavelengths from $\lambda=4$ μm to 7 μm may be of importance for sensing and chemical imaging in the automotive industry (oil and brake leaks sensing), in environmental sensing in factories and building (acetone, methanol, trichloroethylene evaporations control and CO2 monitoring), or in humidity sensing, for example. In addition, these MIR wavelengths may be used in applications in night vision, in tomography (e.g. optical diffusion tomography ODT), in invisible fences, or in optical and digital imaging (e.g. Si/Ge based CCD detectors), for example.

The detection system 500 may include or may be (but is not limited to these areas and devices), a MIR sensor for detection and sensing of $CO_2$. Alternatively or optionally, the detection system may include or may be a MIR sensor for detection and sensing of liquids. Alternatively or optionally, the detection system 500 may include emitters and detectors for night vision applications. Alternatively or optionally, the detection system may include emitters and detectors for tomography applications. Alternatively or optionally, the detection system 500 may include emitters and detectors for invisible fences and alarms. Alternatively or optionally, the detection system 500 may include emitters and detectors for digital and optical imaging.

More details and aspects are mentioned in connection with the embodiments described above or below. The embodiments shown in FIG. 5A may comprise one or more optional additional features corresponding to one or more aspects mentioned in connection with the proposed concept or one or more embodiments described above (e.g. FIGS. 1A to 4) or below (e.g. FIGS. 5B to 7).

Figure 5B:
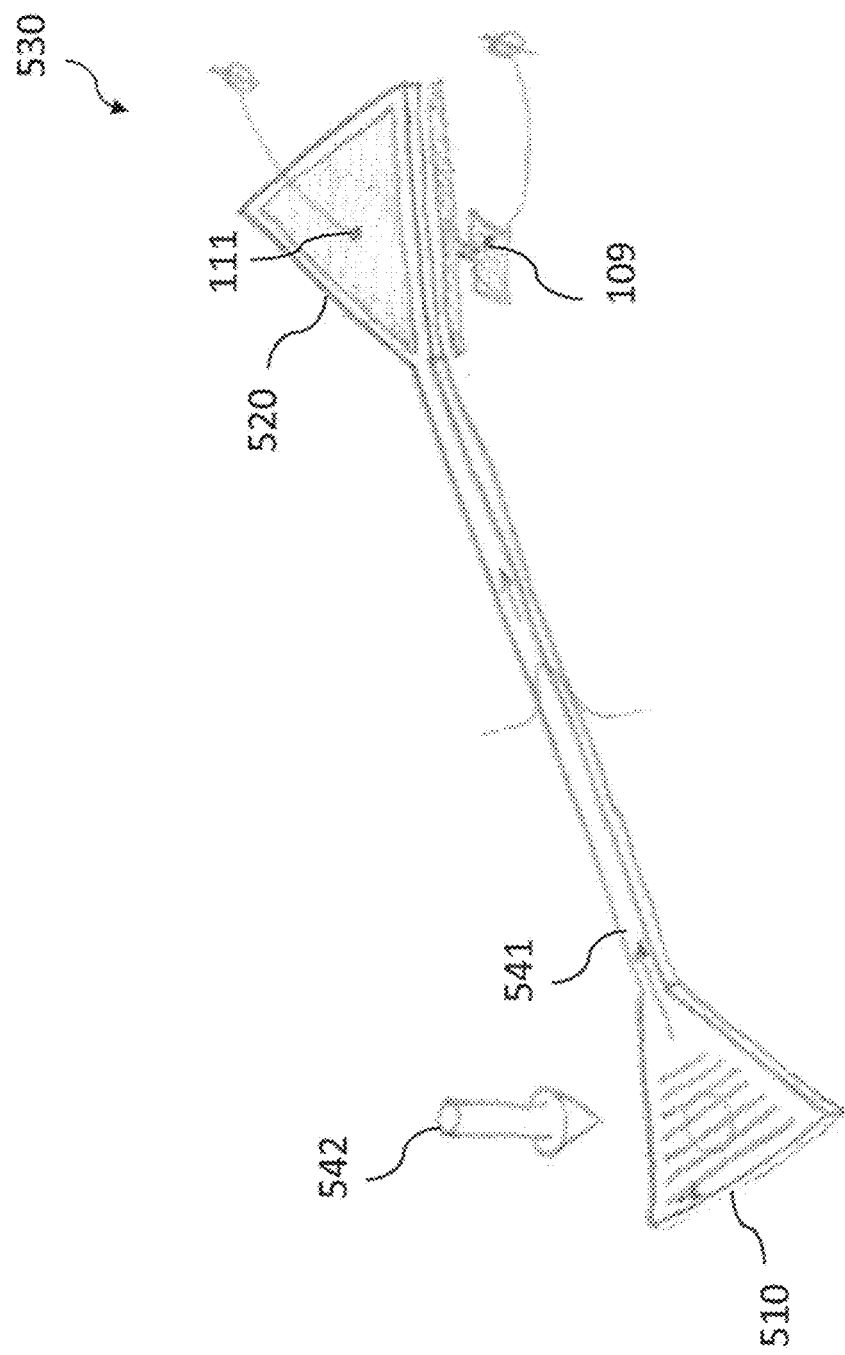

FIG. 5B shows a schematic illustration of a further detection system 530 according to an embodiment.

The emitter device 510 may be formed in an input taper region of a detection system, for example. For example, the Si/Ge nanostructures (quantum structures) may be formed in the input taper regions.

The detector device 520 may be formed in an output taper region of a detection system 530, for example. For example, the Si/Ge nanostructures (quantum structures) may be formed in the output taper regions. Light emission from the emitter device 510 may be coupled from the emitter device 510 to the detector device 520 (e.g. by a waveguide 541), and subsequently detected by the detector device 520, for example.

Optionally, the first electrical contact structure and the second electrical contact structure of the semiconductor device of the emitter device may be omitted. Optionally, a light source 542 (e.g. a laser beam) may be used to excite the quantum structures or quantum wells to emit light with a light emission maximum at a wavelength of between 2 μm and 10 μm (or e.g. between 5 μm and 7 μm), for example.

FIG. 5B shows the optical mean of the excitation of the Si/Ge nanostructures. The nanostructures are in the taper regions in the input and the output. This may allow easier connections of the metal contacts (e.g. the first electrical contact structure 109 and the second electrical contact structure 111), and a larger amount (or number) of Ge quantum dots or Ge quantum wells can be placed in the taper (which may increase emission and absorption intensity), for example. The output from the detector device 520 at the output may be an electrical signal which may be measured by the first electrical contact structure 109 and the second electrical contact structure 111, for example.

More details and aspects are mentioned in connection with the embodiments described above or below. The embodiments shown in FIG. 5B may comprise one or more optional additional features corresponding to one or more aspects mentioned in connection with the proposed concept or one or more embodiments described above (e.g. FIGS. 1A to 5A) or below (e.g. FIGS. 5C to 7).

FIG. 5C shows a schematic illustration of a further detection system 540 according to an embodiment.

In the detection system 540, the first electrical contact structure 109 and the second electrical contact structure 111 of the semiconductor device of the emitter device 510 may be included, so that an applied voltage at or between the first electrical contact structure 109 and the second electrical contact structure 111 causes the semiconductor device of the emitter device 510 to emit light with a light emission maximum at a wavelength of between 5 µm and 7 µm.

FIG. 5C shows the electrical mean of the excitation of the Si/Ge nanostructures by (applied voltage) bias, for example. The output from the detector at the output is an electrical signal, for example.

More details and aspects are mentioned in connection with the embodiments described above or below. The embodiments shown in FIG. 5C may comprise one or more optional additional features corresponding to one or more aspects mentioned in connection with the proposed concept or one or more embodiments described above (e.g. FIGS. 1A to 5B) or below (e.g. FIGS. 5D to 7).

Figure 5D:
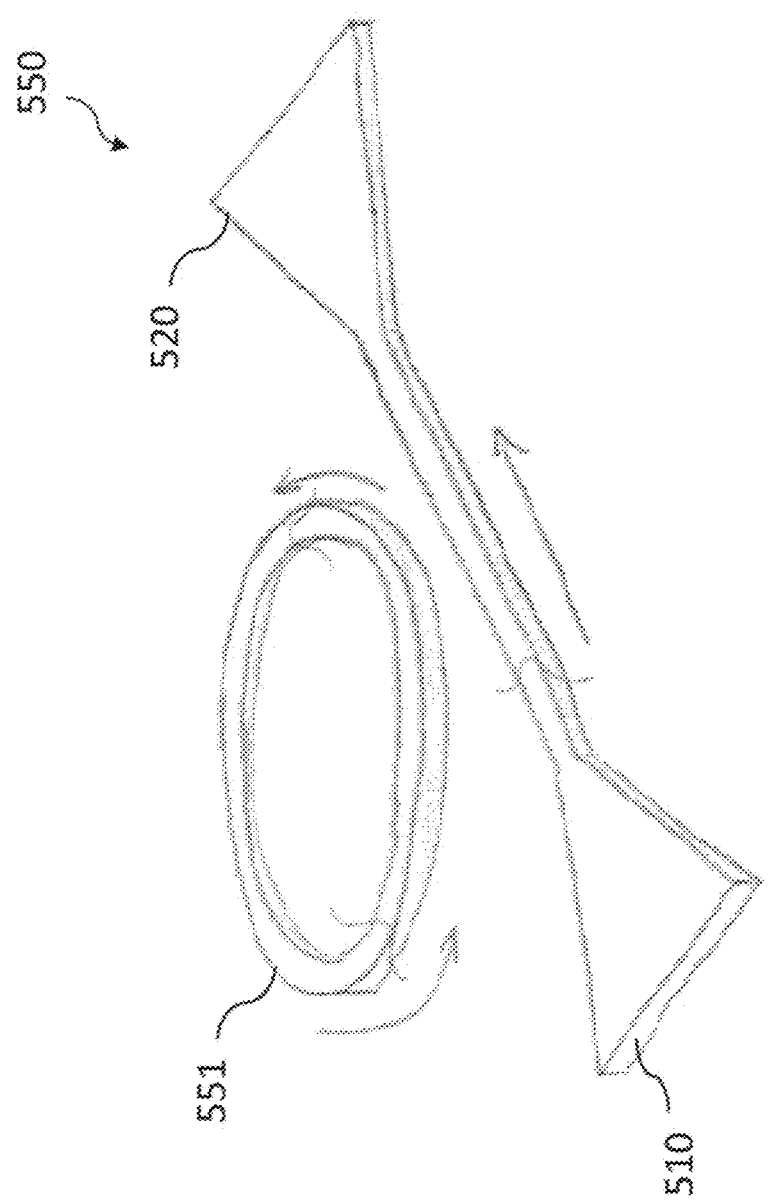

FIG. 5D shows a schematic illustration of a further detection device 550 according to an embodiment.

The detection device 550 may be similar to the detection device of FIG. 5A to 5C. Additionally, the detection device 550 may include a resonator structure 551 (e.g. a single-ring resonator structure coupled to the waveguide 541). The ring resonator 551 may act as an amplifier of the intensity of the emission from the Si/Ge nanostructures (e.g. from the quantum structures or quantum well layer stack of the emitter device 510, for example. It may also increase the sensitivity of the sensor, in case the device is fabricated as a sensor, for example.

More details and aspects are mentioned in connection with the embodiments described above or below. The embodiments shown in FIG. 5D may comprise one or more optional additional features corresponding to one or more aspects mentioned in connection with the proposed concept or one or more embodiments described above (e.g. FIGS. 1A to 5C) or below (e.g. FIGS. 5E to 7).

Figure 5E:
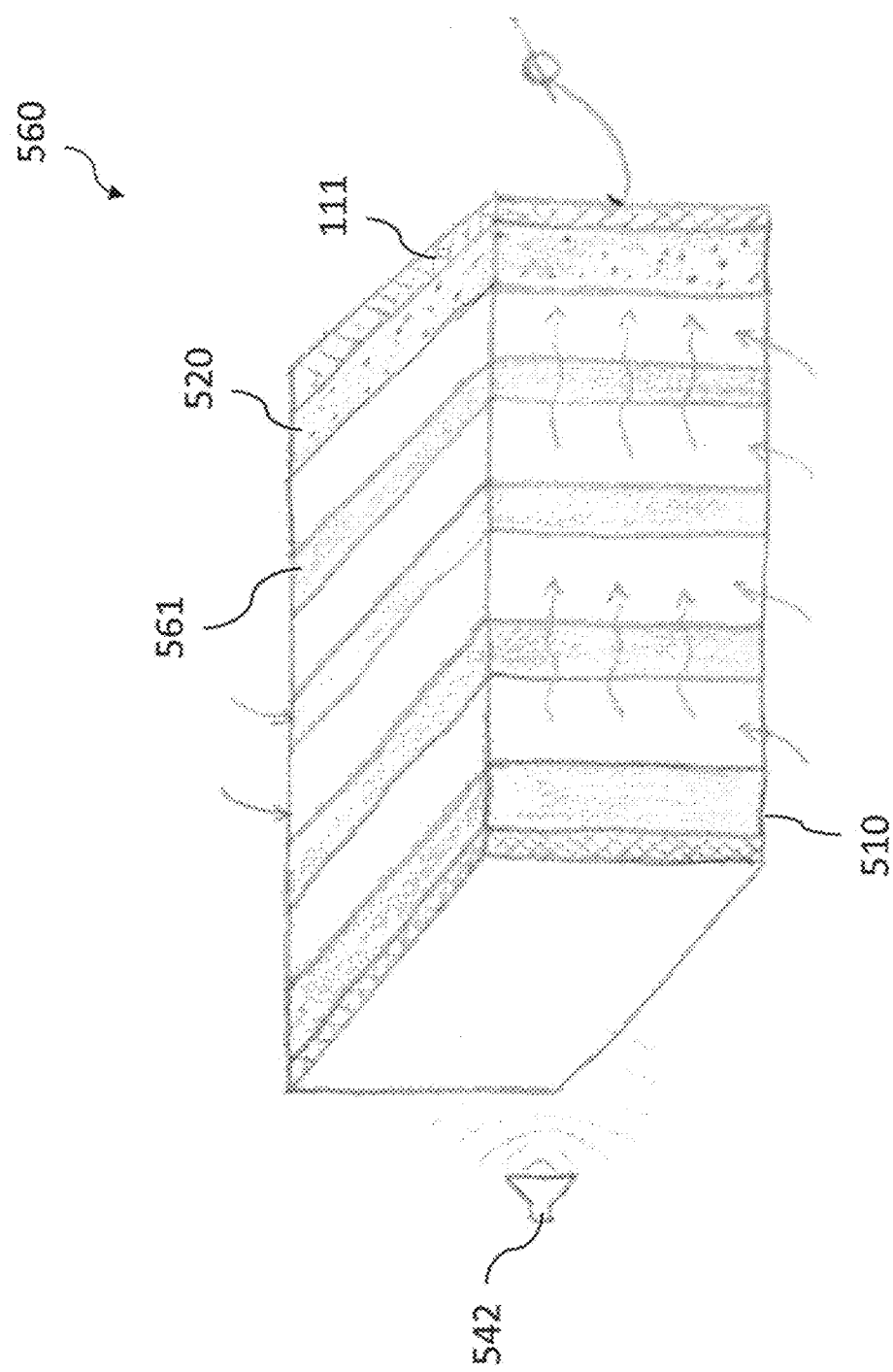

FIG. 5E shows a schematic illustration of a detection system 560 comprising a sensor according to an embodiment.

The detection system 560 may include the emitter device 510, the detector device 520. The interaction volume may be a one-dimensional (1D) photonic crystal, for example. The quantum structures or quantum well layers of the emitter device 510 may be excited by a light beam or by an applied bias. Light emitted by the emitter device 510 interacts with the substance to be detected ($CO_2$ denoted by the curved errors) by the detector device 520 before reaching the detector device 520. The detector device 520 absorbs the light after interaction with the substance. The (absorbed light) or output from the detector device 520 may be measured as an electrical signal, via metal electrical contact structures (e.g. indium tin oxide ITO contacts), for example. The detection system 560 may be a $CO_2$ sensor, for example.

The emitter device 510 may be based on Si/Ge nanostructures may provide high emission intensity. The required emission intensity may vary depending on the application, for example. The detector device 520 based on Si/Ge nanostructures may provide high detectivity and/or responsivity. The required detectivity and/or responsivity may vary depending on the application. For a sensor (detection) device, which incorporates the emitter device, an interaction volume and the detector device, the detection device may have a high sensitivity, which may also vary depending on its application.

In order to increase the sensitivity of the device (e.g. sensor), the interaction volume may include a resonator structure, which may increase the interaction between the light and the sensed substance or fluid (liquid or gas). The resonator structure may be incorporated in order to amplify the intensity of the emission from the emitter. A filter, for instance in a the form of a 1D or (two-dimensional) 2D PhC 561, may be incorporated adjacent to the emitter in order to filter out the unwanted part of the emission spectra from the emitter. Additionally, alternatively or optionally, for the case of a sensor, the interaction volume may be designed as a 1D or 2D PhC (or 1D or 2D PhC resonator) in order to filter out the unwanted part of the emission spectra from the emitter. Additionally, alternatively or optionally, a current amplifier may be realized adjacent to the detector to amplify the signal output from the detector. In addition, a multiple number (e.g. a plurality) of structures may be fabricated on a single chip in order to further boost the performance of the device.

The detection system 560 and semiconductor devices may be formed at least by fabrication, characterization and optimization of the Si/Ge nanostructures, device fabrication and device characterization, for example.

For the semiconductor devices and detection systems described herein, the plurality of quantum structures may be configured to emit light or absorb light at a wavelength ($\lambda$) of between 5 µm and 7 µm (e.g. at 4.2 µm or 6.2 µm) by varying the size of the quantum structures (dots) up to 15 nm. Additionally or optionally, the doping of the quantum structures (dots) may be varied (e.g. by varying a doping concentration of antimony atoms), for example. For example, the doping may be used to change the size of the quantum dots and to modify the band gap of the quantum dots, for example. Additionally or optionally, the doping may be used to create intermediate electron or hole states. Additionally or optionally, the tensile or crystallographic strain between the layer of germanium quantum dots and the layer beneath them and the cap layer above them, may be varied so that the plurality of quantum structures emit light or absorb light at a wavelength ($\lambda$) of between 5 µm and 7 µm (e.g. at 4.2 µm or 6.2 µm).

More details and aspects are mentioned in connection with the embodiments described above or below. The embodiments shown in FIG. 5E may comprise one or more optional additional features corresponding to one or more aspects mentioned in connection with the proposed concept or one or more embodiments described above (e.g. FIGS. 1A to 5D) or below (e.g. FIGS. 6 to 7).

Figure 6:
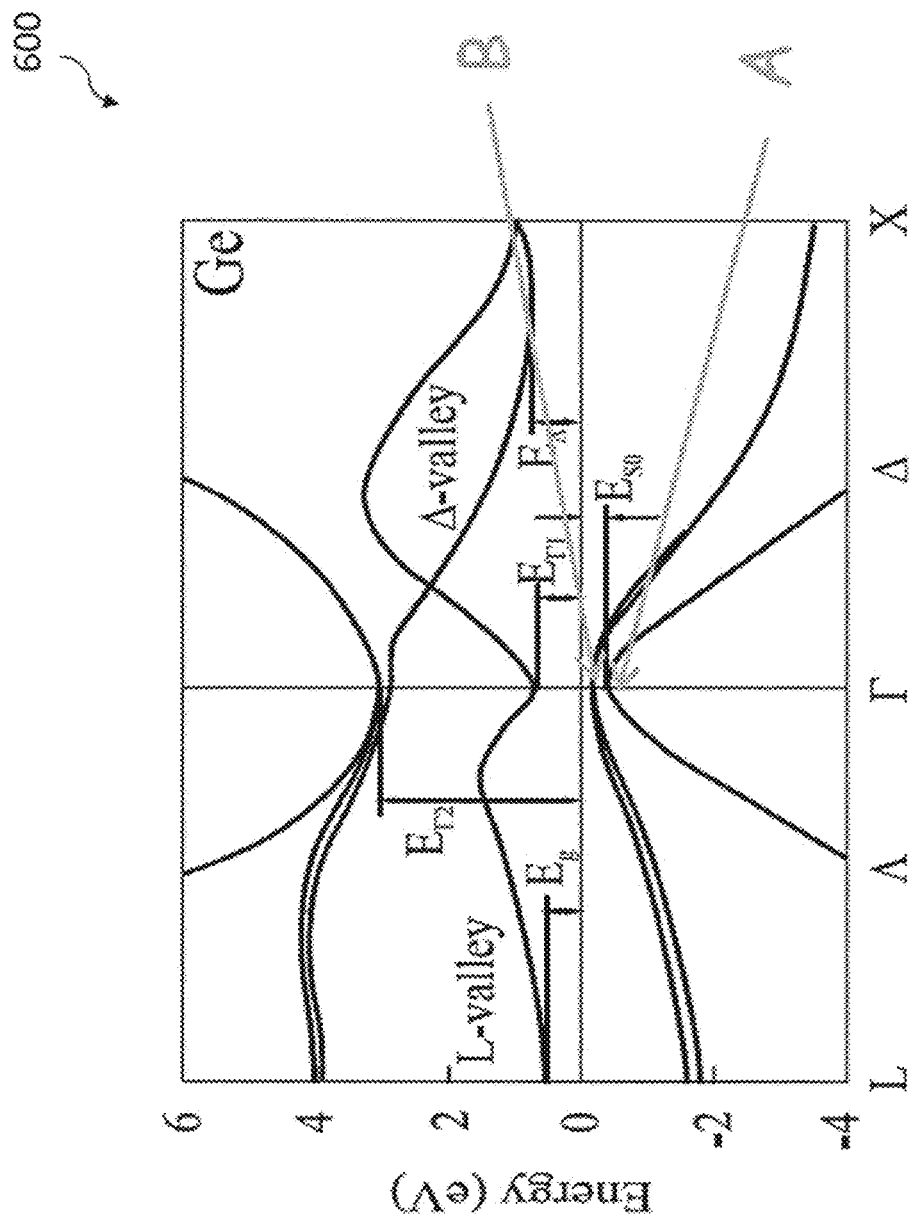
FIG. 6 shows a schematic illustration of the band structure of Ge and Si.

FIG. 6 shows a schematic illustration of the band structure 600 of Ge, Si, Ge quantum dots for hole transitions in the valence band. Si and Ge have an indirect band structure. For Si, 6 Emin at $$K_0 = 0.85 \frac{2\pi}{a}.$$

The indirect bandgap is $E_{gap}$=1.17 eV at T=0° and is $E_{gap}$=1.12 eV at T=300°. For Ge, $E_{gap}$=0.66 eV, $E_A$=0.85 eV, $E_{\Gamma 1}$=0.8 eV, $E_{\Gamma 2}$=3.2 eV and $E_{SO}$=0.29 eV at T=300°.

Hole transitions may occur in the valance bands between bands A and B, for example. The hole transitions may occur at different positions of the k-vector value (e.g. not necessarily at the Γ point) by applying the external bias, for example.

Crystallographic strain may be used to obtain band modifications in order to achieve the required MIR transitions across the band gap or the hole transitions in the valence band. For example, the band structure of Ge and/or Si may be modified by the use of crystallographic strain (when growing Ge on Si or vice versa). For example, relaxed bulk Ge has an indirect bandgap of 0.664 eV at the L valley and a direct bandgap of 0.800 eV at the Γ valley. Tensile strained intrinsic Germanium (i-Ge) may have band modifications, e.g. in the valence band. For example, the direct and indirect bandgap may be reduced. For example, the bandgap between a light holes band maximum and conduction band minimum may be reduced and the bandgap between a heavy holes band maximum and conduction band minimum may be reduced. For bulk germanium, during carrier injection injected electrons and injected holes may recombine inefficiently via the indirect bandgap. By n-type doping of germanium (e.g. n+ doping of Ge), extrinsic electrons may fill the L valleys. For tensile strained n+ Ge, the injected electrons may be directed into the direct Γ valley to recombine with the injected holes, resulting in efficient direct gap light emission. The doping may achieved several transitions across the band gap.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1A to 5E) or below (FIG. 7).

Figure 7:
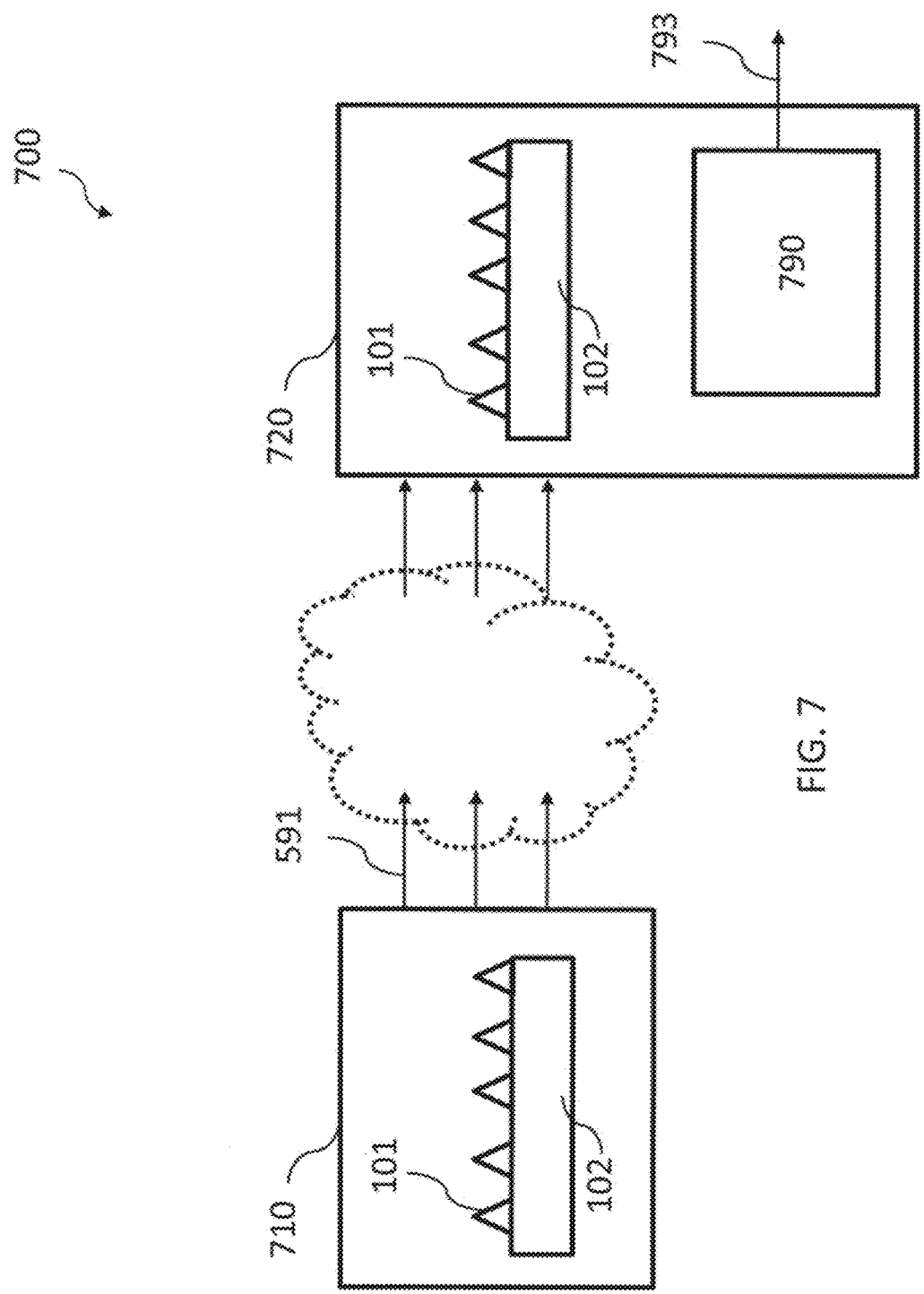
FIG. 7 shows a schematic illustration of a fluid sensor according to an embodiment.

FIG. 7 shows a schematic illustration of a fluid sensor 700 according to an embodiment.

The fluid sensor 700 comprises a detector 720. The detector 720 comprises a processing module 790 configured to generate a detection signal 793 based on light 591 emitted by an emitter 710 and propagated through a fluid. The detector 720 or the emitter 710 comprises a plurality of quantum structures 101 comprising predominantly germanium. The plurality of quantum structures are formed on a first semiconductor layer structure 102. The quantum structures of the plurality of quantum structures 101 have a lateral dimension of less than 15 nm and an area density of at least $1 \times 10^{10}$ quantum structures per $cm^2$. The plurality of quantum structures 101 are configured to emit light with a light emission maximum at a wavelength of between 2 μm and 10 μm or to absorb light with a light absorption maximum at a wavelength of between 2 μm and 10 μm.

Due to the fluid sensor 700 having a plurality of quantum structures 101 being configured to emit light with a light emission maximum at a wavelength of between 2 μm and 10 μm or to absorb light with a light absorption maximum at a wavelength of between 2 μm and 10 μm, efficient fluid sensors capable of detecting liquids or gases such as carbon dioxide or liquids may be obtained.

The detection signal 793 generated by the processing module may be a signal (e.g. an electrical signal) carrying information related to the type or concentration of the gas or liquid, for example.

The fluid sensor 700 may be similar to the detection systems described in connection with FIGS. 5A to 5E. Furthermore, the emitter and the detector of the fluid sensor 700 may be similar to the emitters and detectors described in connection with FIGS. 1A to 6. The fluid sensor 700 may be a fluid sensor for detecting carbon dioxide gas, for example.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1A to 6) or below.

Aspects and features (e.g. the plurality of quantum structures, the first semiconductor layer structure, the second semiconductor layer structure, the first silicon sub-layer of the first semiconductor layer structure, the first silicon buffer sub-layer of the first semiconductor layer structure, the first intrinsic silicon sub-layer of the first semiconductor layer structure, the highly-doped silicon sub-layer of the first semiconductor layer structure, the seed sub-layer of the first semiconductor layer structure, the second semiconductor layer structure, the first silicon sub-layer of the second semiconductor layer structure, the quantum well layer stack, the plurality of first quantum well layers, the plurality of second quantum well layers, the detection system, the emitter device, the detector device, the fluid sensor, and methods for forming the semiconductor device) mentioned in connection with one or more specific examples may be combined with one or more of the other examples.

Various embodiments relate to a single-platform integration of germanium quantum dots (QDs) and quantum wells (QW) grown by selective-growth CVD as a mid-infrared source and mid-infrared detector for optoelectronic applications, for example.

Various embodiments relate to an absorption-based sensor for gases and liquids, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons.

Furthermore, in some embodiments a single act may include or may be broken into multiple sub acts. Such sub acts may be included and part of the disclosure of this single act unless explicitly excluded.

What is claimed is:

1. A semiconductor device, comprising:
   a quantum well layer stack comprising a plurality of first quantum well layers and a plurality of second quantum well layers, wherein first quantum well layers of the plurality of first quantum well layers and second quantum well layers of the plurality of second quantum well layers are arranged alternatingly on a first semiconductor layer structure,
   wherein the first quantum well layers of the plurality of first quantum well layers comprise silicon-germanium and the second quantum well layers of the plurality of second quantum well layers comprise silicon,
   wherein the first quantum well layers of the plurality of first quantum well layers and the second quantum well layers of the plurality of second quantum well layers have a thickness of below 100 nm, and
   wherein the quantum well layer stack is configured to emit light with a light emission maximum at a wavelength of between 2 µm and 10 µm or to absorb light with a light absorption maximum at a wavelength of between 2 µm and 10 µm.

2. The semiconductor device according to claim 1, wherein the first quantum well layers comprises silicon$_x$-germanium$_{1-x}$, wherein x lies between 0.25 and 0.35.

3. The semiconductor device according to claim 1, comprising:
   a first electrical contact structure in electrical contact with a first semiconductor layer structure; and
   a second electrical contact structure in electrical contact with a second semiconductor layer structure, wherein the plurality of first quantum well layers and the plurality of second quantum well layers are arranged between the first semiconductor layer structure and the second semiconductor layer structure,
   wherein the quantum well layer stack is configured to emit light with a light emission maximum at a wavelength of between 5 µm and 7 µm or to absorb light with a light absorption maximum at a wavelength of between 5 µm and 7 µm based on a voltage applied to the first electrical contact structure and the second electrical contact structure, wherein the applied voltage lies between 1 V and 10 V.

4. The semiconductor device according to claim 1, wherein the first quantum well layers of the plurality of first quantum well layers have a thickness between 1 nm and 10 nm.

5. The semiconductor device according to claim 1, wherein the second quantum well layers of the plurality of second quantum well layers have a thickness between 1 nm and 10 nm.

6. The semiconductor device according to claim 1, wherein a second quantum well layer, of the plurality of second quantum well layers, is arranged between consecutive first quantum well layers, of the plurality of first quantum well layers, and
   a first quantum well layer, of the plurality of first quantum well layers, is arranged between consecutive second quantum well layers, of the plurality of second quantum well layers.

7. The semiconductor device according to claim 1, further comprising:
- a second semiconductor layer structure covering the quantum well layer stack.

8. The semiconductor device according to claim 1, wherein the quantum well layer stack is configured to emit light with the light emission maximum at a wavelength of between 5 μm and 7 μm.

9. The semiconductor device according to claim 1, wherein the quantum well layer stack is configured to absorb light with the light absorption maximum at a wavelength of between 5 μm and 7 μm.

\* \* \* \* \*